United States Patent
Yoshiyama et al.

(10) Patent No.: US 11,768,979 B2
(45) Date of Patent: Sep. 26, 2023

(54) INFORMATION PROCESSING DEVICE AND INFORMATION PROCESSING METHOD

(71) Applicants: Sony Corporation, Tokyo (JP); Sony Semiconductor Solutions Corporation, Kanagawa (JP)

(72) Inventors: Kazuki Yoshiyama, Kanagawa (JP); Takumi Yajima, Tokyo (JP); Ryoji Ikegaya, Tokyo (JP)

(73) Assignees: SONY CORPORATION, Tokyo (JP); SONY SEMICONDUCTOR SOLUTIONS CORPORATION, Kanagawa (JP)

(*) Notice: Subject to any disclaimer, the term of this patent is extended or adjusted under 35 U.S.C. 154(b) by 566 days.

(21) Appl. No.: 16/981,289

(22) PCT Filed: Dec. 27, 2018

(86) PCT No.: PCT/JP2018/048288
§ 371 (c)(1),
(2) Date: Sep. 16, 2020

(87) PCT Pub. No.: WO2019/181137
PCT Pub. Date: Sep. 26, 2019

(65) Prior Publication Data
US 2021/0042453 A1    Feb. 11, 2021

(30) Foreign Application Priority Data
Mar. 23, 2018   (JP) .................... 2018-056468

(51) Int. Cl.
*G06F 30/20*   (2020.01)
*G06N 3/04*   (2023.01)

(52) U.S. Cl.
CPC ............ *G06F 30/20* (2020.01); *G06N 3/04* (2013.01)

(58) Field of Classification Search
CPC ................................ G06F 30/20; G06N 3/04
See application file for complete search history.

(56) References Cited

U.S. PATENT DOCUMENTS

2015/0092597 A1* 4/2015 Guo ................ H04L 41/12
370/254
2018/0018555 A1* 1/2018 Wong ................ G06N 3/105

FOREIGN PATENT DOCUMENTS

JP   04-051384 A   2/1992
JP   H04051384 A   2/1992
(Continued)

OTHER PUBLICATIONS

Suda, N., Chandra, V., Dasika, G., Mohanty, A., Ma, Y., Vrudhula, S., Seo, J.S. and Cao, Y., Feb. 2016, Throughput-optimized OpenCL-based FPGA accelerator for large-scale convolutional neural networks. In Proceedings of the 2016 ACM/SIGDA International Symposium on Field-Programmable Gate Arrays (Year: 2016).*

(Continued)

*Primary Examiner* — Chuen-Meei Gan
(74) *Attorney, Agent, or Firm* — XSENSUS LLP

(57) ABSTRACT

[Problem] To provide design support useful for hardware implementation of a neural network.
[Solution] Provided is an information processing device including a control unit that controls presentation of information related to an optimization structure when at least a part of a network structure of a designed neural network has been optimized for hardware processing. Provided is an information processing method including a step of controlling, by a processor, presentation of information related to an optimization structure when at least a part of a network structure of a designed neural network has been optimized for hardware processing.

17 Claims, 23 Drawing Sheets

(56) References Cited

FOREIGN PATENT DOCUMENTS

JP      2013-088924 A    5/2013
WO  WO-2017187798 A  11/2017

OTHER PUBLICATIONS

Naveen Suda et al: "Throughput-Optimized OpenCL-based FPGA Accelerator for Large-Scale Convolutional Neural Networks", Proceedings of the 2016 ACM/SIGDA International Symposium on Field-Programmable Gate Arrays, FPGA'16, Feb. 21, 2016 (Feb. 21, 2016), pp. 16-25, XP055542357, New York, New York, USA DOI: 10.1145/2847263.2847276, ISBN: 978-1-4503-3856-1.
International Search Report and Written Opinion dated Apr. 9, 2019 for PCT/JP2018/048288 filed on Dec. 27, 2018, 11 pages including English Translation of the International Search Report.
Yamamoto, R., et al., "A Concept of DNN Framework for Embedded System Using FPGA," IEICE Technical Report, vol. 117, No. 455, ISSN 0913-5685, Feb. 21, 2018, pp. 169-174.
Shindo, S., et al., "Review of CNN accelerator that performs an approximate calculation based on kernel similarity," IEICE Technical Report, vol. 117, No. 479, ISSN 0913-5685, Mar. 8, 2018, pp. 179-184.
Kato, S., et al., "The Next Technology," 1st edition, Nikkei Business Publications, Inc., ISBN978-4-8222-7975-2, May 30, 2015, p. 108.

* cited by examiner

FIG.10

| | | | | |
|---|---|---|---|---|
| Input | 3, 64, 64 | | Input | 3, 64, 64 |
| RDivScalar Value: 256 | 3, 64, 64 | | RDivScalar Value: 256 | 3, 64, 64 |
| Convolution KarnelShape : 3,3 | 64, 64, 64 | | Convolution KarnelShape : 3,3 | 64, 64, 64 |
| BatchNormalization | 64, 64, 64 | | BatchNormalization | 64, 64, 64 |
| ReLU | 64, 64, 64 | | ReLU | 64, 64, 64 |
| MaxPooling Shape : 2,2 | 64, 32, 32 | | MaxPooling Shape : 2,2 | 64, 32, 32 |
| Convolution_2 KarnelShape : 5,5 | 70, 32, 32 | ⇒ | Convolution_2 KarnelShape : 5,5 | 64, 32, 32 |
| BatchNormalization_2 | 70, 32, 32 | | BatchNormalization_2 | 64, 32, 32 |
| ReLU_2 | 70, 32, 32 | | ReLU_2 | 64, 32, 32 |
| MaxPooling_2 Shape : 2,2 | 70, 16, 16 | | MaxPooling_2 Shape : 2,2 | 64, 16, 16 |
| Convolution_3 KarnelShape : 5,5 | 64, 16, 16 | | Convolution_3 KarnelShape : 5,5 | 64, 16, 16 |
| SumPooling Shape : 2,2 | 64, 8, 8 | | SumPooling Shape : 2,2 | 64, 8, 8 |
| Affine | 100 | | Affine | 100 |
| SoftmaxCrossEntropy | 1 | | SoftmaxCrossEntropy | 1 |

| Layer Property | |
|---|---|
| C Convolution | |
| Name | Convolution_2 |
| Input | 64, 32, 32 |
| OutMaps | 64 |
| KernelShape | 5, 5 |
| WithBias | False |
| BorderMode | same |
| Padding | 2, 2 |
| Strides | 3, 3 |
| ... | |

⇧

LP3a

| Layer Property | |
|---|---|
| C Convolution | |
| Name | Convolution_2 |
| Input | 64, 32, 32 |
| OutMaps | 64 |
| KernelShape | 5, 5 |
| WithBias | False |
| BorderMode | same |
| Padding | 2, 2 |
| Strides | 2, 2 |
| ... | |

FIG.22

```
def mnist_lenet_prediction(image, test=False, aug=None):
    """
    Construct LeNet for MNIST.
    """
    image /= 255
    image = augmentation(image, test, aug)
    c1 = PF.convolution(image, 16, (5, 5), name='conv1')
    c1 = F.relu(F.max_pooling(c1, (2, 2)), inplace=True)
    c2 = PF.convolution(c1, 16, (5, 5), name='conv2')
    c2 = F.relu(F.average_pooling(c2, (2, 2)), inplace=True)
    c3 = F.relu(PF.affine(c2, 50, name='fc3'), inplace=True)
    c4 = PF.affine(c3, 10, name='fc4')
    return c4
```

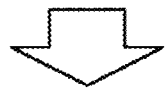

```
def mnist_lenet_prediction(image, test=False, aug=None):
    """
    Construct LeNet for MNIST.
    """
    image /= 256
    image = augmentation(image, test, aug)
    c1 = PF.pow2_convolution(image, 16, (5, 5), name='conv1')
    c1 = F.relu(F.max_pooling(c1, (2, 2)), inplace=True)
    c2 = PF.pow2_convolution(c1, 16, (5, 5), name='conv2')
    c2 = F.relu(F.sum_pooling(c2, (2, 2)), inplace=True)
    c3 = F.relu(PF.pow2_affine(c2, 50, name='fc3'), inplace=True)
    c4 = PF.pow2_affine(c3, 10, name='fc4')
    return c4
```

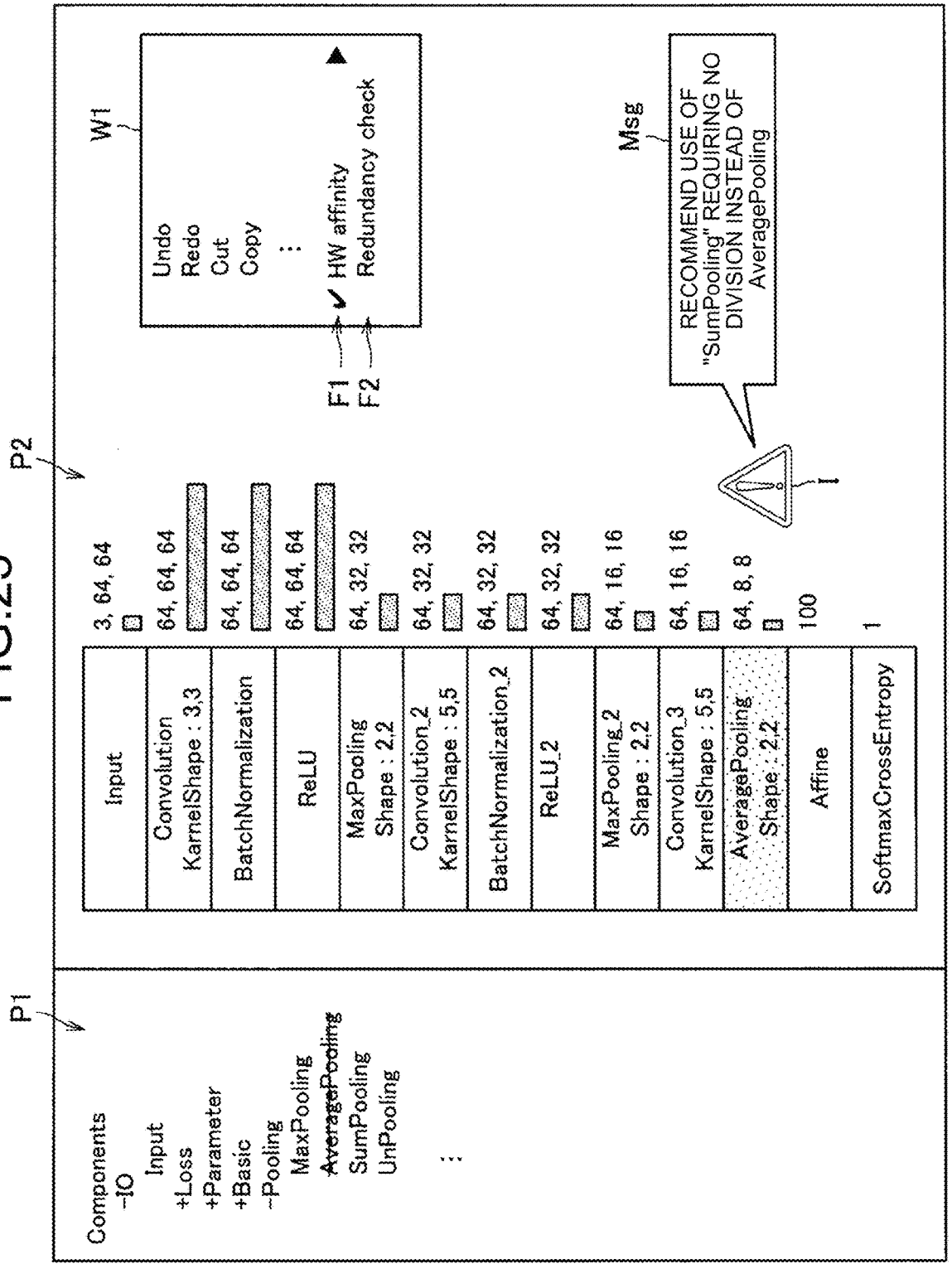

INFORMATION PROCESSING DEVICE AND INFORMATION PROCESSING METHOD

CROSS-REFERENCE TO RELATED APPLICATIONS

The present application is based on PCT filing PCT/JP2018/048288, filed Dec. 27, 2018, which claims priority to JP 2018-056468, filed Mar. 23, 2018, the entire contents of each are incorporated herein by reference.

FIELD

The present disclosure relates to an information processing device and an information processing method.

BACKGROUND

In recent years, various functions using a neural network have been developed. Furthermore, various methods have been proposed for improving the development efficiency of the neural network. For example, Non-Patent Literature 1 discloses information related to a software library available for developing the neural network.

CITATION LIST

Non-Patent Literature

Non-Patent Literature 1: Google Research, "TensorFlow: Large-ScaleMachine Learning on Heterogeneous Distributed Systems", Nov. 9, 2015, [Online], [Searched on Jan. 12, 2016], the Internet <http://download.tensorflow.org/paper/whitepaper2015.pdf>

SUMMARY

Technical Problem

Meanwhile, in recent years, there has also been proposed a method in which high speed is achieved with low cost by implementing a neural network as hardware instead of operating the neural network as software on a processor. However, in the software library disclosed in Non-Patent Literature 1, design support considering the hardware implementation of the neural network may not be sufficient.

In this regard, the present disclosure suggests novel and improved information processing device and information processing method capable of providing design support useful for hardware implementation of a neural network.

Solution to Problem

According to the present disclosure, an information processing device is provided that includes: a control unit that controls presentation of information related to an optimization structure when at least a part of a network structure of a designed neural network has been optimized for hardware processing.

Moreover, according to the present disclosure, an information processing method is provided that includes: a step of controlling, by a processor, presentation of information related to an optimization structure when at least a part of a network structure of a designed neural network has been optimized for hardware processing.

Advantageous Effects of Invention

As described above, according to the present disclosure, it is possible to provide design support useful for hardware implementation of a neural network.

Note that the aforementioned effects are not always restrictive, and in addition to or instead of the aforementioned effects, any of the effects described in the present specification or other effects that can be understood from the present specification may be obtained.

BRIEF DESCRIPTION OF DRAWINGS

FIG. 10 is a diagram for explaining optimization for the purpose of applying a shift calculation according to the embodiment.

FIG. 19 is a diagram for explaining optimization for the purpose of suppressing the width of a stride to 2 or less according to the embodiment.

FIG. 22 is a diagram for explaining information presentation of an optimization structure in a programming tool for performing code description according to the embodiment.

FIG. 23 is a diagram illustrating an example of presentation of information related to an optimization structure according to the embodiment.

DESCRIPTION OF EMBODIMENTS

Figure 1:
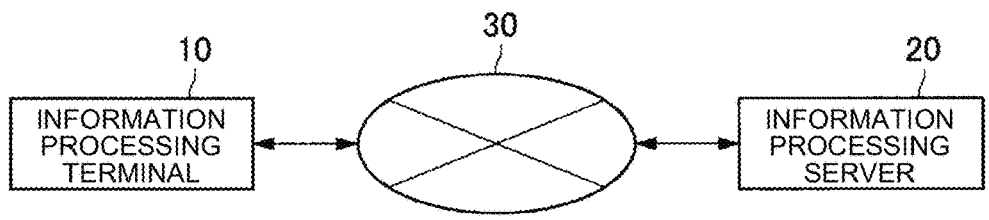
FIG. 1 is a block diagram illustrating a configuration example of an information processing system according to an embodiment of the present disclosure.

Hereinafter, preferred embodiments of the present disclosure will be described in detail with reference to the accompanying drawings. Note that in the present specification and the drawings, components having substantially the same functional configurations are denoted by the same reference numerals and a description thereof will be omitted in order to avoid redundancy.

Note that the description will be given in the following order.

1. Embodiment
  1.1 Overview
  1.2 System configuration example
  1.3 Functional configuration of information processing terminal 10
  1.4 Functional configuration of information processing server 20
  1.5 Presentation of information related to optimization structure
  1.6 Example of presentation of information related to optimization structure
2. Hardware configuration example
3. Summary 1. Embodiment 1.1 Overview First, an overview according to an embodiment of the present disclosure will be described. As described above, in recent years, various methods have been proposed for improving the development efficiency of a neural network. On the other hand, there has also been proposed a method in which high-speed processing is achieved by implementing the neural network as hardware.

However, in the software library disclosed in Non-Patent Literature 1, and the like, generally, design support considering the hardware implementation of the neural network is not sufficient. Therefore, when a neural network is implemented as hardware, a hardware designer needs to adjust a neural network, which has been constructed by repeating design, learning, and evaluation based on input data by a software designer, for hardware.

In the aforementioned work, the hardware designer repeats adjustment, learning, and evaluation for hardware of the neural network based on the input data and the neural network constructed by the software designer, thereby achieving the hardware implementation of the neural network.

However, the adjustment, learning, and evaluation work by the hardware designer requires a lot of time. Particularly, since a period of about one day to one month is required for the learning, there has been required a method for improving the efficiency of the aforementioned work by the hardware designer.

The technical idea according to the embodiment of the present disclosure was conceived in view of the aforementioned points and can provide design support useful for hardware implementation of a neural network. One of the characteristics of an information processing device for implementing an information processing method according to the embodiment of the present disclosure is that the information processing device includes a control unit that controls presentation of information related to an optimization structure when at least a part of a network structure of a designed neural network has been optimized for hardware processing.

That is, the information processing device according to the embodiment of the present disclosure allows a user to be presented with various proposals related to optimization of the network structure in which a software designer can design a neural network specialized for hardware in advance.

In accordance with the aforementioned function of the information processing device according to the embodiment of the present disclosure, a software designer can easily design a neural network in consideration of hardware implementation, so that it is possible to eliminate double effort of a hardware designer and to significantly improve the efficiency of work for implementing the neural network as hardware.

Hereinafter, characteristics of functions of the information processing device according to the embodiment of the present disclosure and effects produced by the characteristics will be described in detail.

1.2 System Configuration Example

Next, a configuration example of an information processing system according to the embodiment of the present disclosure will be described. FIG. 1 is a block diagram illustrating a configuration example of the information processing system according to the present embodiment. Referring to FIG. 1, the information processing system according to the present embodiment includes an information processing terminal 10 and an information processing server 20. Furthermore, the information processing terminal 10 and the information processing server 20 are connected via a network 30 such that they can communicate with each other.

Information Processing Terminal 10

The information processing terminal 10 according to the present embodiment is a client terminal for programming a neutral network. The information processing terminal 10 according to the present embodiment displays a form for programming under the control of the information processing server 20, and transmits to the information processing server 20 information related to a user's input operation to the form. The information processing terminal 10 according to the present embodiment may be, for example, a personal computer (PC) and the like. As will be described below, the information processing terminal 10 according to the present embodiment may also serve as an information processing device having the same function as the information processing server 20.

Information Processing Server 20

The information processing server 20 according to the present embodiment is the information processing device that implements the information processing method according to the present embodiment. The information processing server 20 according to the present embodiment controls presentation of information related to an optimization structure when a neural network has been optimized for hardware processing. The information processing server 20 according to the present embodiment transmits the information related to the optimization structure to the information processing terminal 10 based on at least a part of a network structure input from the information processing terminal 10, for example.

Network 30

The network 30 has a function of connecting the information processing terminal 10 and the information processing server 20. The network 30 may include a public network such as the Internet, a telephone network, and a satellite communication network, various local area networks (LANs) including Ethernet (registered trademark), a wide area network (WAN), and the like. Furthermore, the network 30 may include a dedicated network such as internet protocol-virtual private network (IP-VPN). Furthermore, the network 30 may include a wireless communication network such as Wi-Fi (registered trademark) and Bluetooth (registered trademark).

So far, the configuration example of the information processing system according to the embodiment of the present disclosure has been described. Note that the configuration described above with reference to FIG. 1 is merely an example and the configuration of the information processing system according to the present embodiment is not limited to such an example. The configuration of the information processing system according to the present embodiment can be flexibly modified according to specifications and operation.

1.3 Functional Configuration of Information Processing Terminal 10

Figure 2:
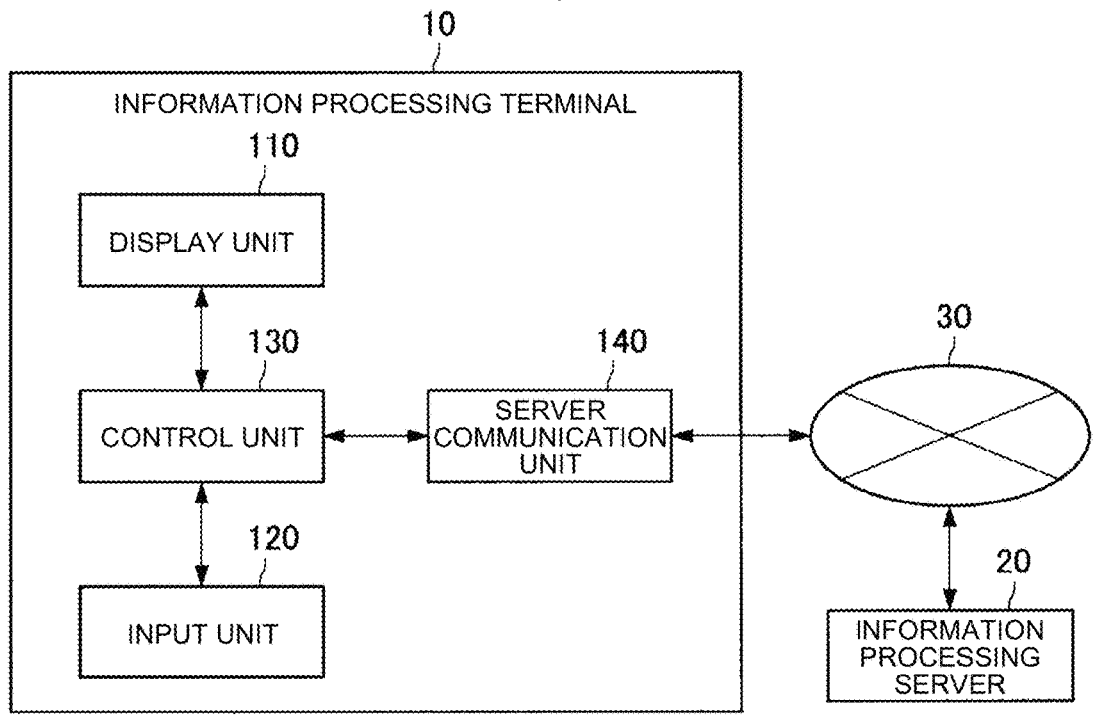
FIG. 2 is a block diagram illustrating a functional configuration example of an information processing terminal according to the embodiment.

Next, a functional configuration example of the information processing terminal 10 according to the embodiment of the present disclosure will be described. FIG. 2 is a block diagram illustrating a functional configuration example of the information processing terminal 10 according to the present embodiment. Referring to FIG. 2, the information processing terminal 10 according to the present embodiment includes a display unit 110, an input unit 120, a control unit 130, and a server communication unit 140.

Display Unit 110

The display unit 110 according to the present embodiment has a function of outputting visual information such as an image and text. The display unit 110 according to the present embodiment displays a form related to visual programming of a neutral network under the control of the information processing server 20, for example.

Therefore, the display unit 110 according to the present embodiment includes a display that presents the visual information. Examples of the display includes a liquid crystal display (LCD), an organic light emitting diode (OLED) display, a touch screen display, and the like. Furthermore, the display unit 110 according to the present embodiment may output the visual information using a projection function.

Input Unit 120

The input unit 120 according to the present embodiment has a function of detecting an input operation by a user. The input unit 120 according to the present embodiment detects, for example, an arrangement operation of components or units on the form. Therefore, the input unit 120 according to the present embodiment includes a keyboard, a touch screen, a mouse, various buttons, and the like.

Control Unit 130

The control unit 130 according to the present embodiment has a function of controlling each component included in the information processing terminal 10. The control unit 130 controls, for example, activation and deactivation of each component. Furthermore, the control unit 130 inputs a control signal generated by the information processing server 20 to the display unit 110. Furthermore, the control unit 130 according to the present embodiment may have the same function as a form control unit 210 of the information processing server 20 to be described below.

Server Communication Unit 140

The server communication unit 140 according to the present embodiment has a function of performing information communication with the information processing server 20 via the network 30. Specifically, the server communication unit 140 receives a control signal related to form control from the information processing server 20. Furthermore, the server communication unit 140 transmits information related to the user's input operation detected by the input unit 120 to the information processing server 20.

So far, the functional configuration example of the information processing terminal 10 according to the embodiment of the present disclosure has been described. Note that the configuration described above with reference to FIG. 2 is merely an example and the functional configuration of the information processing terminal 10 according to the present embodiment is not limited to such an example. For example, as described above, the control unit 130 according to the present embodiment may have the same function as the form control unit 210 of the information processing server 20. The functional configuration of the information processing terminal 10 according to the present embodiment can be flexibly modified according to specifications and operation.

1.4 Functional Configuration of Information Processing Server 20

Figure 3:
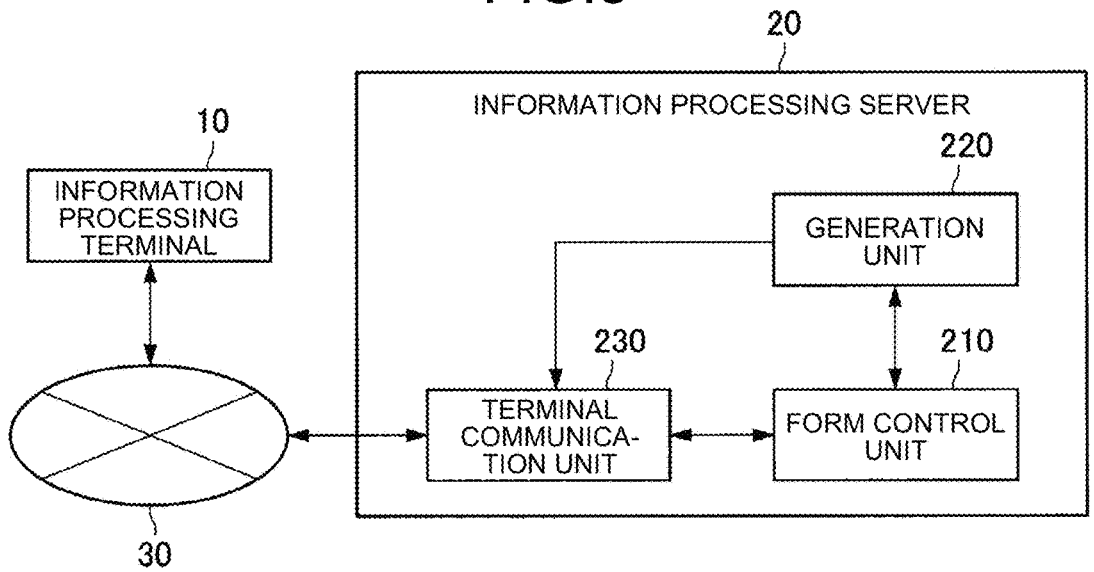
FIG. 3 is a block diagram illustrating a functional configuration example of an information processing server according to the embodiment.

Next, a functional configuration of the information processing server 20 according to the embodiment of the present disclosure will be described. FIG. 3 is a block diagram illustrating a functional configuration example of the information processing server 20 according to the present embodiment. Referring to FIG. 3, the information processing server 20 according to the present embodiment includes the form control unit 210, a generation unit 220, and a terminal communication unit 230.

Form Control Unit 210

The form control unit 210 according to the present embodiment operates as a control unit that controls presentation of information related to an optimization structure when at least a part of a network structure of a designed neural network has been optimized for hardware processing.

The information related to the optimization structure according to the present embodiment may include, for example, information related to a difference between a current network structure and a network structure after optimization. The form control unit 210 may suggest layer information after replacement, and the like, to a user when some layers of the current network structure have been optimized.

Furthermore, at this time, the form control unit 210 according to the present embodiment can improve knowledge of a user regarding design considering the hardware implementation of the neural network by allowing the user to be presented with the reason that the optimization needs to be performed together with the information related to the difference.

Furthermore, the information related to the optimization structure according to the present embodiment may also be the optimized network structure itself. In such a case, the form control unit 210 enables the user to be presented with the network structure in which an input network structure has been optimized for hardware. At this time, actual optimization processing may also be performed by the generation unit 220.

So far, the overview of the function of the form control unit 210 according to the present embodiment has been described. Details of the function of the form control unit 210 according to the present embodiment will be separately described below.

Generation Unit 220

The generation unit 220 according to the present embodiment has a function of generating a source code related to the neutral network based on information input in the form controlled by the form control unit 210. Furthermore, the generation unit 220 according to the present embodiment has a function of optimizing the input network structure for hardware processing.

Terminal Communication Unit 230

The terminal communication unit 230 according to the present embodiment performs information communication with the information processing terminal 10 via the network 30. Specifically, the terminal communication unit 230 transmits the information related to the optimization structure generated by the form control unit 210 and the control signal related to the form control to the information processing terminal 10. Furthermore, the terminal communication unit 230 receives the information related to the user's input operation on the form, and the like, from the information processing terminal 10.

So far, the functional configuration example of the information processing server 20 according to the embodiment of the present disclosure has been described. Note that the configuration described above with reference to FIG. 3 is merely an example and the functional configuration of the information processing server 20 according to the present embodiment is not limited to such an example. For example, the configuration described above may be implemented by being distributed to a plurality of devices. Furthermore, as described above, the function of the form control unit 210 may also be implemented as the function of the control unit 130 of the information processing terminal 10. The functional configuration of the information processing server 20 according to the present embodiment can be flexibly modified according to specifications and operation.

1.5 Presentation of Information Related to Optimization Structure

Next, the control of the information presentation related to the optimization structure according to the present embodiment will be described in detail. Hereinafter, a case where the form control unit 210, which is an example of the control unit according to the present disclosure, allows the information related to the optimization structure to be presented on a programming tool used for designing the neutral network will be described as an example. On the other hand, the control unit according to the present embodiment may also serve as, for example, a part of a batch program that outputs the information related to the optimization structure with respect to an input network structure.

Furthermore, in the following description, a case where, in a tool for implementing visual programming of the neutral network, the form control unit 210 according to the present embodiment controls a form with which a user performs the visual programming will be described as a main example.

Here, the visual programming refers to a method of generating a computer program by using a visual object in software development without writing a program code in text. In the visual programming, for example, a computer program can be generated by operating an object on a graphical user interface (GUI).

Figure 4:
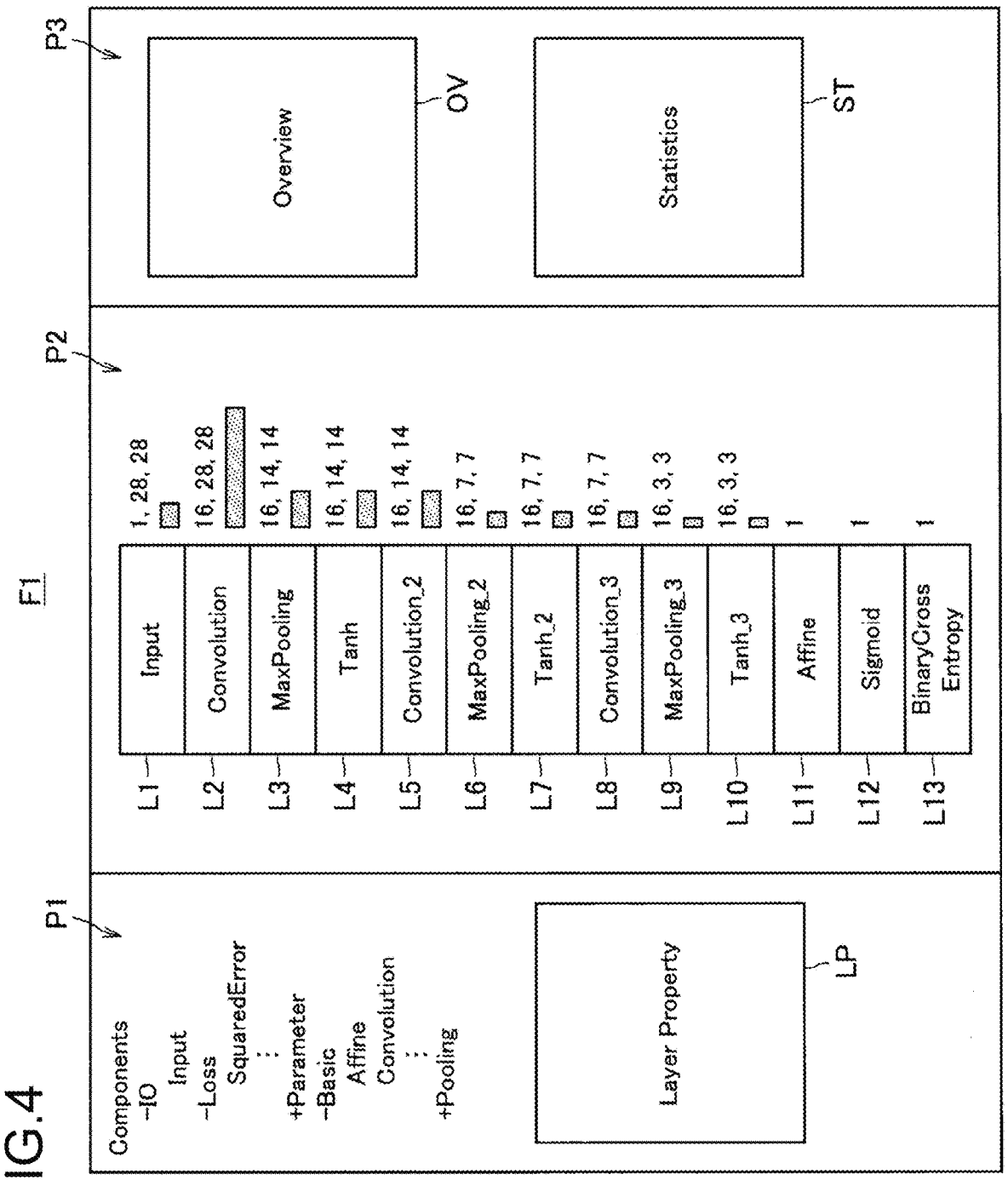
FIG. 4 is a diagram illustrating a display example of a form according to the embodiment.

Hereinafter, a display example of the form controlled by the form control unit 210 according to the present embodiment will be described. FIG. 4 is a diagram illustrating the display example of the form according to the present embodiment. As illustrated in FIG. 4, a form F1 according to the present embodiment includes, for example, panes P1 to P3.

The pane P1 may be an area for displaying a list of layers for configuring a network. As illustrated in FIG. 4, various layers may be displayed in the pane P1 for each classification. Furthermore, by clicking a classification name, the list of the layers for each classification may be controlled to be developed. Furthermore, property information LP of a selected layer is displayed in the pane P1. By editing the property information LP, a user can set, for example, an output size of each layer, a kernel shape, the presence or absence of a bias, and the like.

The pane P2 is an area for arranging the layers and constructing a neutral network. The user can visually construct the neutral network by moving, adding, or deleting each layer. In the case of the example illustrated in FIG. 4, a network structure composed of layers L1 to L13 is visually displayed in the pane P2. The user can add any component to the pane P2 by dragging and dropping components displayed in the pane P1, for example.

The pane P3 is an area for displaying various types of information related to the neutral network being constructed. In the pane P3, for example, an overview OV indicating an overall image of the network structure, statistical information ST related to the neutral network, and the like may be displayed.

Note that the statistical information ST according to the present embodiment includes, for example, information such as an output size, an amount of a memory used for parameters, and amounts of various calculations. Furthermore, the form control unit 210 according to the present embodiment may have a function of comparing values of components selected by the user among the aforementioned components, which are included in the statistical information ST, for each layer and presenting the compared values. At this time, the form control unit 210 according to the present embodiment may associate, for example, the value of a component for each layer and an indicator indicating the magnitude of the value of the component with each layer, and present the associated result.

In the case of an example illustrated in FIG. 4, based on the selection of the output size by the user, the form control unit 210 allows the value of the output size for each layer and an indicator corresponding to the value to be displayed. In accordance with the aforementioned function of the form control unit 210 according to the present embodiment, the user can intuitively perceive the output size and the calculation amount of each layer, and use the perceived information as a reference at the time of a change and the like of the network structure.

Figure 5:
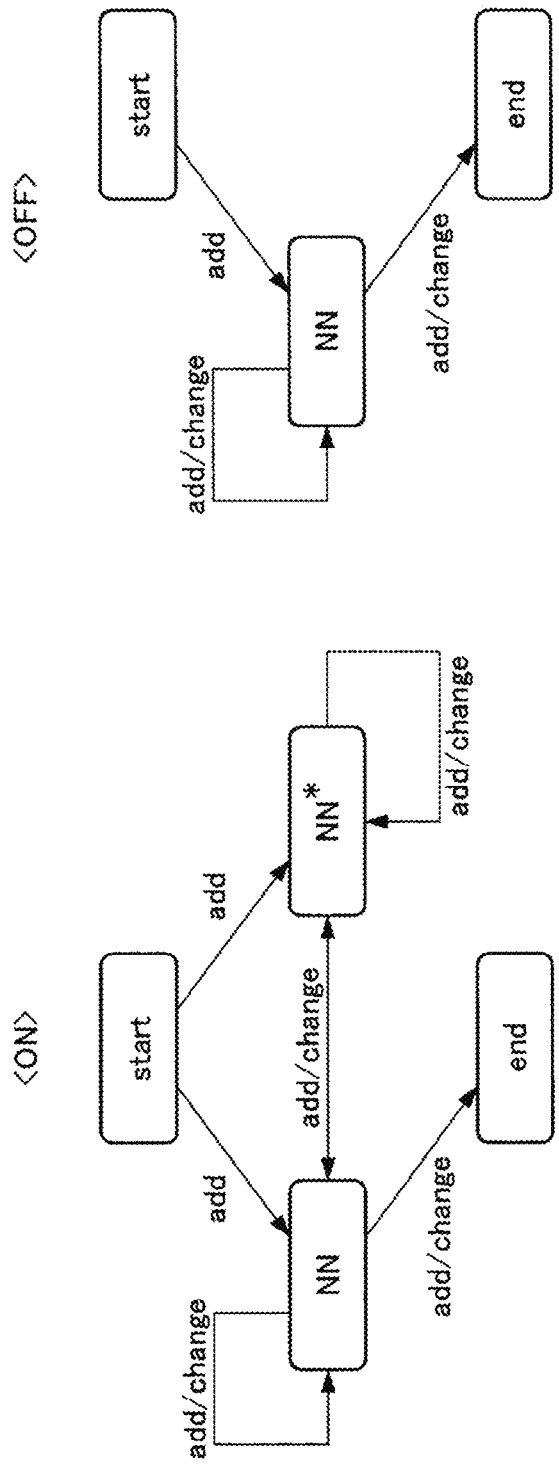
FIG. 5 is a diagram for explaining state transitions of a network structure according to the embodiment.

So far, the display example of the form according to the present embodiment has been described. Subsequently, state transitions of the network structure according to the present embodiment will be described. FIG. 5 is a diagram for explaining the state transitions of the network structure according to the present embodiment.

The left side of FIG. 5 illustrates a state transition when a presentation function of the information related to the optimization structure of the present embodiment is turned on, and the right side of FIG. 5 illustrates a state transition when the presentation function is turned off.

In FIG. 5, "NN" indicates a neural network and "NN*" indicates a neural network in a state in which the network is not optimized for hardware and the information related to the optimization structure is presented (a proposal, a warning, and the like are displayed).

When the presentation function of the information related to the optimization structure is enabled, a layer is first added by a user to start the construction of a network structure. Thereafter, the user repeatedly performs addition, change, deletion, and the like of a layers. At this time, when the generation unit 220 detects the state "NN*", in which the network is not optimized for hardware, by the aforementioned operation, the information related to the optimization structure is dynamically presented under the control of the form control unit 210.

Thereafter, the user repeatedly performs addition, change, deletion, and the like of a layer, so that network construction is completed by moving between "NN" and "NN*".

On the other hand, when the presentation function of the information related to the optimization structure is disabled, even though the network is not optimized for hardware, "NN" is not transitioned to "NN*", that is, without presenting the information related to the optimization structure, network construction is completed.

So far, the state transitions of the network structure according to the present embodiment have been described. Note that the presentation function of the information related to the optimization structure can be switched to be enabled or disabled at any timing even during the execution of programming. The user can enjoy the information related to the optimization structure by disabling the aforementioned presentation function during programming, for example, and enabling the presentation function by, for example, pressing a check button at the time point at which the programming has been completed.

Next, detailed examples of the optimization for hardware processing according to the present embodiment will be described. The form control unit 210 according to the present embodiment can control the presentation of information related to various types of optimization for hardware processing.

Figure 6:
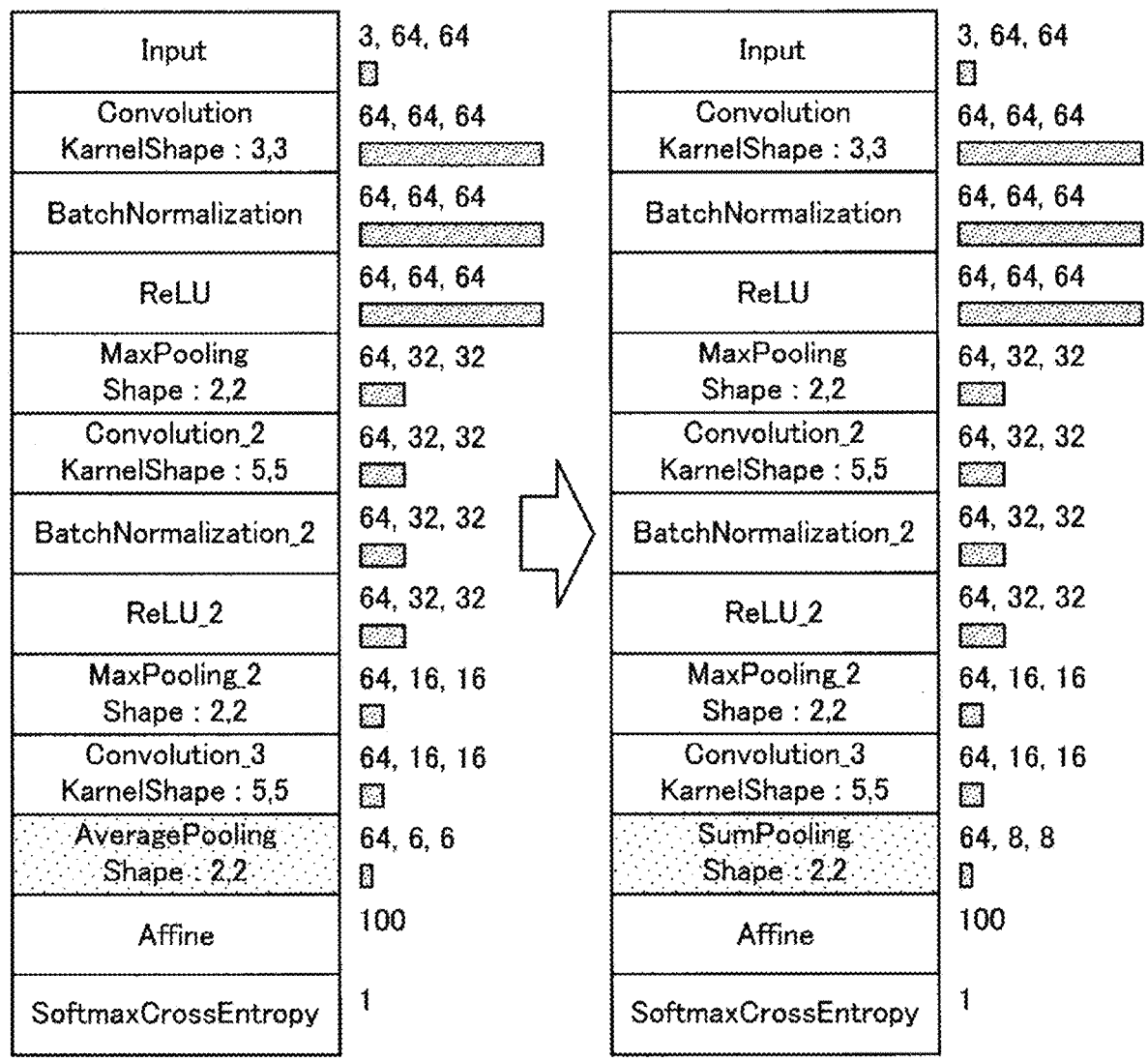
FIG. 6 is a diagram for explaining optimization for the purpose of eliminating division according to the embodiment.

For example, the optimization according to the present embodiment may include a change in a network structure for the purpose of eliminating division. FIG. 6 is a diagram for explaining the optimization for the purpose of eliminating the division according to the embodiment. The left side of FIG. 6 illustrates a network structure designed by a user, and the right side of FIG. 6 illustrates a network structure after being optimized for hardware.

When the two network structures are compared with each other, "AveragePooling" that has been included in a network configuration at the time of design is changed to "SumPooling" after the optimization. Therefore, the form control unit 210 according to the present embodiment can suggest to a user to use "SumPooling" using no division, instead of "AveragePooling" using division with a high calculation cost.

Furthermore, the optimization according to the present embodiment may include a change in a network structure for the purpose of applying a shift calculation. FIG. 7 to FIG. 12 are diagrams for explaining the optimization for the purpose of applying the shift calculation according to the present embodiment. The left sides of FIG. 7 to FIG. 12 illustrate network structures designed by a user, and the right sides of FIG. 7 to FIG. 12 illustrate network structures after being optimized for hardware.

Figure 7:
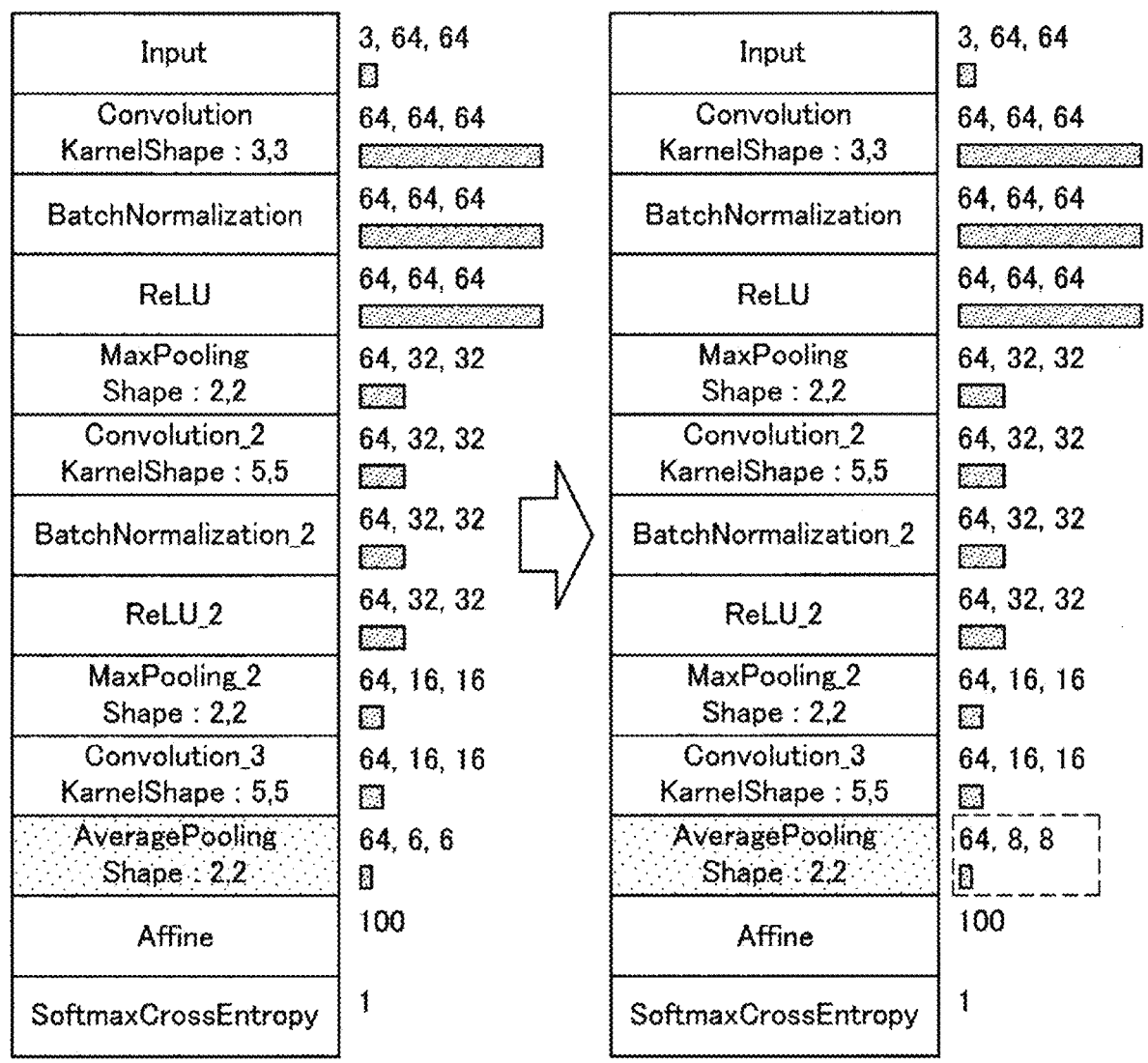
FIG. 7 is a diagram for explaining optimization for the purpose of applying a shift calculation according to the embodiment.

For example, in the case of an example illustrated in FIG. 7, the output size "64, 6, 6" of "AveragePooling" in the network configuration at the time of design is changed to "64, 8, 8" after the optimization. This is because it is not possible to perform the shift calculation when the output size of "AveragePooling" is not the power of 2. Therefore, the form control unit 210 according to the present embodiment may suggest to the user that the output size of "AveragePooling" should be set to the power of 2 so that it is possible to perform the shift calculation with a lower calculation cost than the case of division. The output size can be changed by, for example, adjusting padding of a previous "Convolution" layer.

Figure 8:
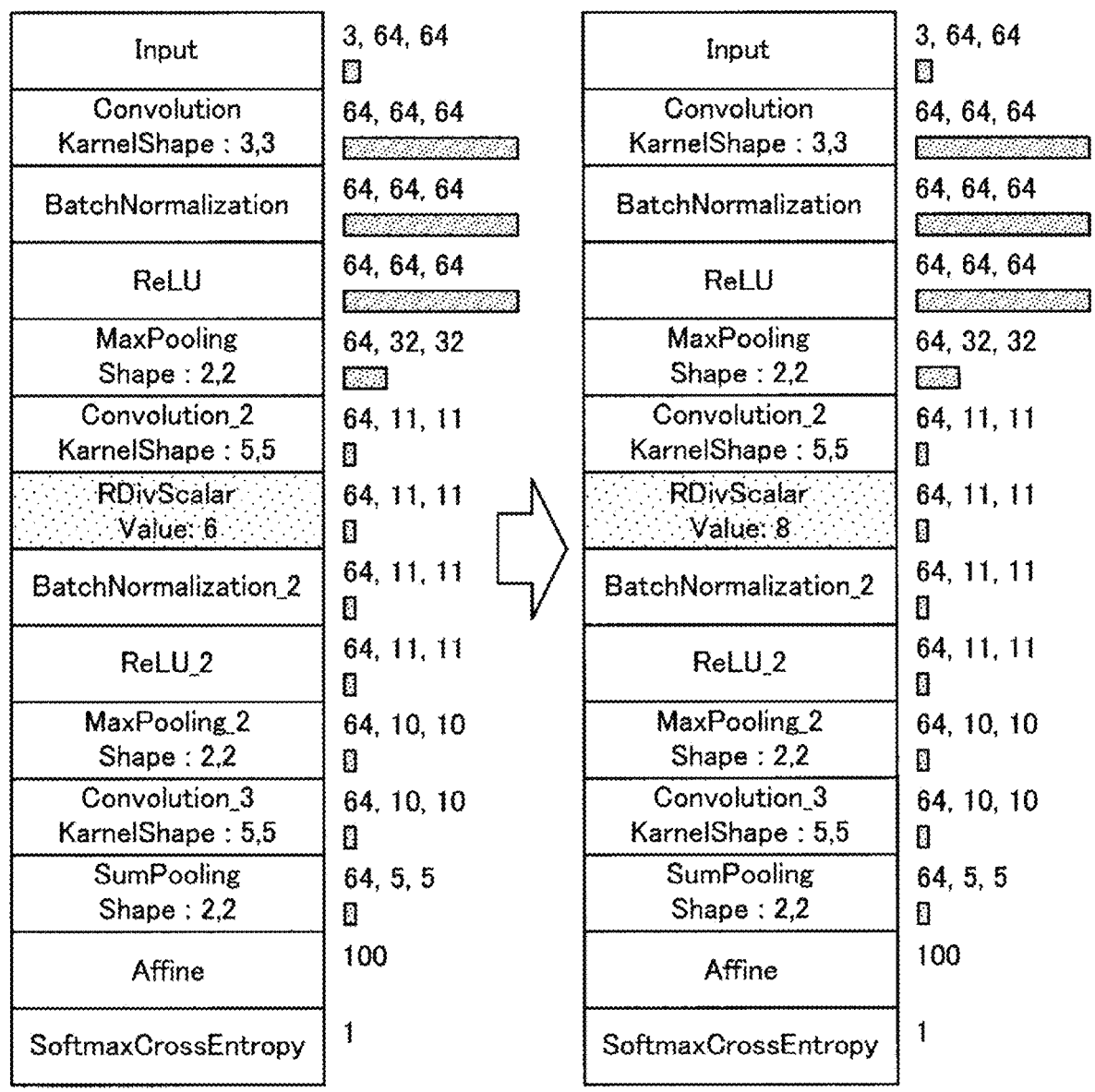
FIG. 8 is a diagram for explaining optimization for the purpose of applying a shift calculation according to the embodiment.

Furthermore, in the case of an example illustrated in FIG. 8, the value "6" of "RDivScalar" in the network configuration at the time of design is changed to "8" after the optimization. This is because the value to be used for division is the power of 2 to apply the shift calculation. Therefore, the form control unit 210 according to the present embodiment may suggest to the user that the value of Division should be set to the power of 2 so that it is possible to perform the shift calculation with a lower calculation cost than the case of division.

Figure 9:
FIG. 9 is a diagram for explaining optimization for the purpose of applying a shift calculation according to the embodiment.

Furthermore, in the case of an example illustrated in FIG. 9, the value "255" of "RDivScalar" in the network configuration at the time of design is changed to "256" after the optimization. In many cases, in image normalization, it is general to use a distribution of "0 to 255", but it is not possible to perform the shift calculation because "255" is not the power of 2. Therefore, the form control unit 210 according to the present embodiment may suggest to the user to reduce the calculation cost by using "256", which is the power of 2, instead of "255". Note that it is experimentally known that there is almost no effect on learning even though the distribution of "0 to 256" is used for the image normalization.

Furthermore, in the case of an example illustrated in FIG. 10, the output size "70, 32, 32" of "Convolution_2" in the network configuration at the time of design is changed to "62, 32, 32" after the optimization. This operation is performed for aligning a memory alignment to the power of 2, and since warp is 32, the output size is also optimized to a multiple of 32. In this way, the form control unit 210 according to the present embodiment may suggest to the user to change the output sizes of "convolution" and the like so that the memory alignment becomes the power of 2.

Figure 11:
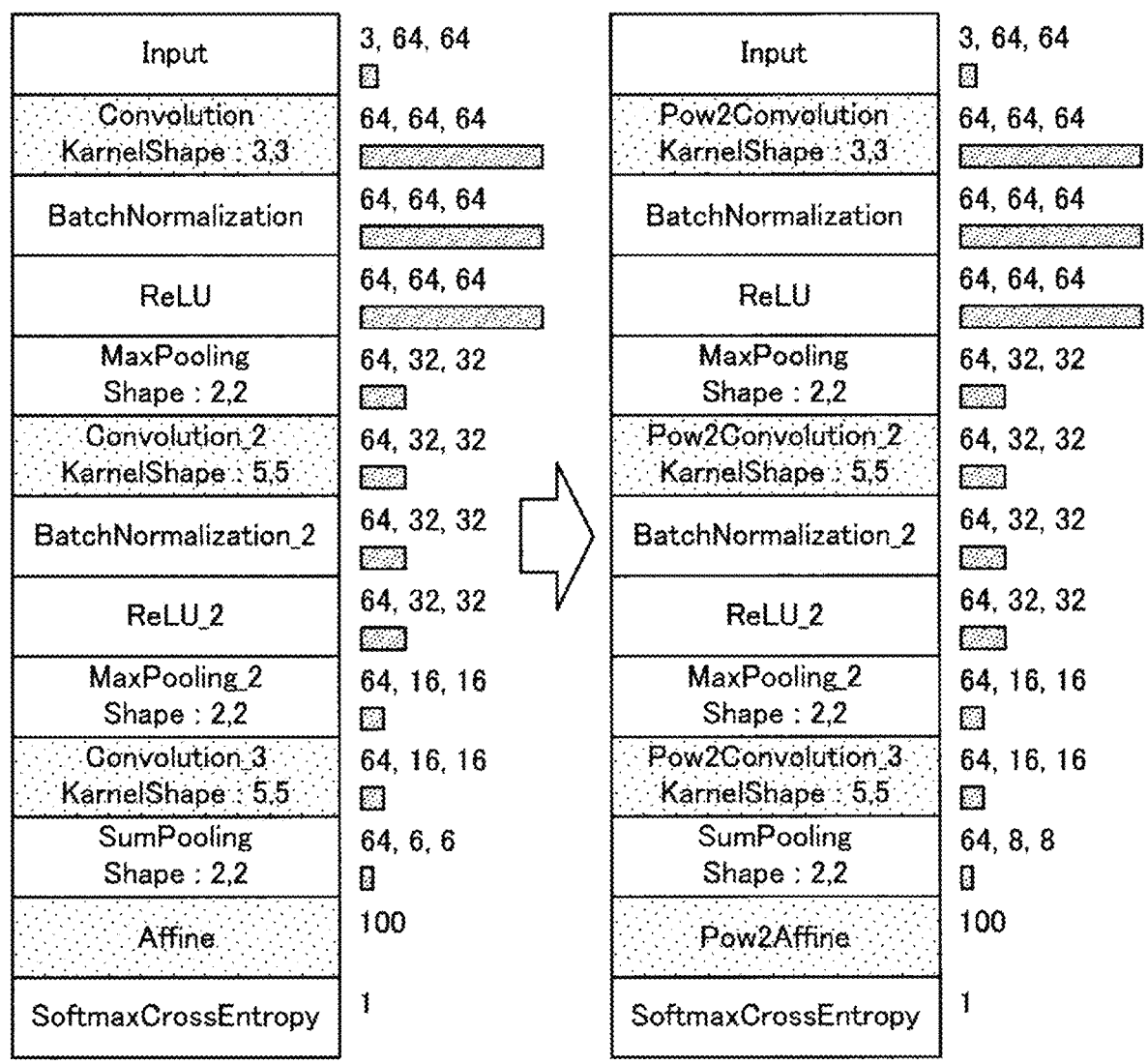
FIG. 11 is a diagram for explaining optimization for the purpose of applying a shift calculation according to the embodiment.

Furthermore, in the case of an example illustrated in FIG. 11, each "Convolution" in the network configuration at the time of design is changed to "Pow2Convolution" after the optimization. "Pow2Convolution" is "Convolution" that performs an inner product calculation by using weights, biases, and the like quantized by the power of 2. With such a layer, it is possible to perform the inner product calculation only by the shift calculation and the addition, so that it is possible to significantly reduce the calculation cost. In this way, the form control unit 210 according to the present embodiment may suggest to the user to use the quantization layer such as "Pow2Convolution", instead of the normal product-sum calculation layer. Note that the quantization method is not limited to the aforementioned example and Binary or Fixed Point may also be used.

Figure 12:
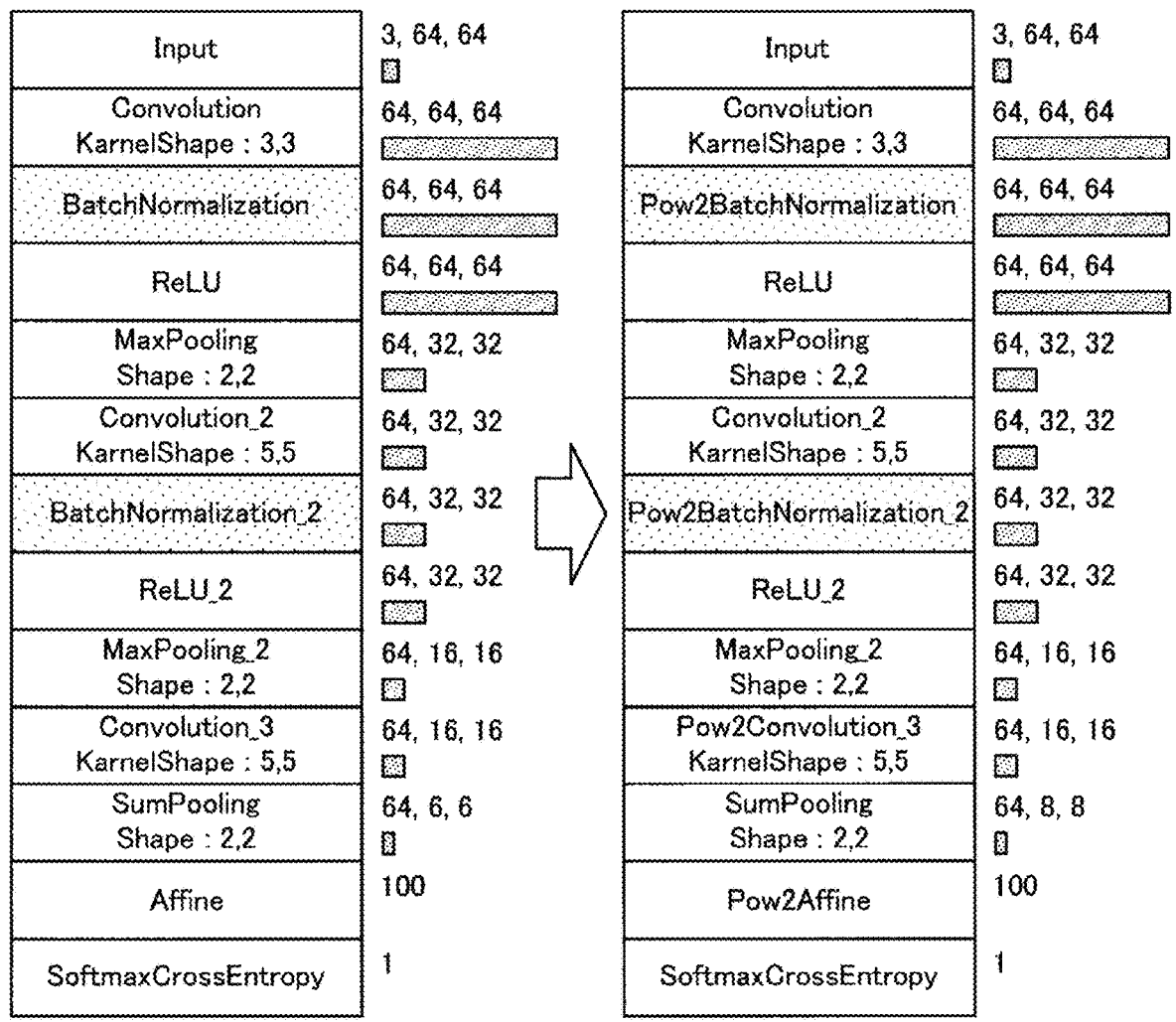
FIG. 12 is a diagram for explaining optimization for the purpose of applying a shift calculation according to the embodiment.

Furthermore, in the case of an example illustrated in FIG. 12, each "BatchNormalization" in the network configuration at the time of design is changed to "Pow2BatchNormalization" after the optimization. The "Pow2BatchNormalization" is "BatchNormalization" that performs a normalization calculation by using a value represented by the power of 2. With such a layer, processing normally performed by the float can be implemented by the shift calculation, so that it is possible to effectively reduce the calculation cost. Therefore, the form control unit 210 according to the present embodiment may suggest to user to use "Pow2BatchNormalization", instead of normal "BatchNormalization".

Figure 13:
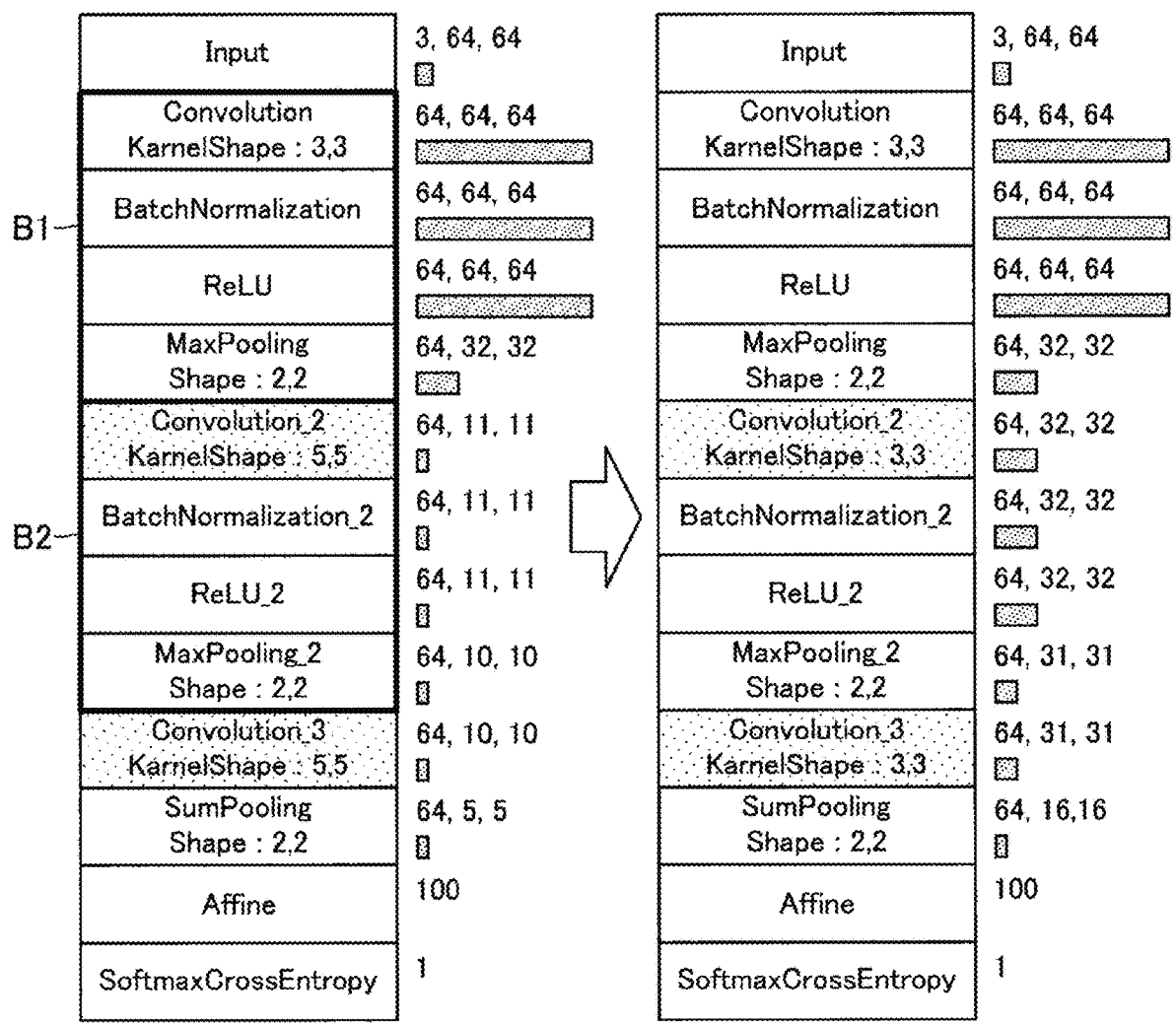
FIG. 13 is a diagram for explaining commonization of a block structure according to the embodiment.

So far, the optimization for the purpose of applying the shift calculation according to the present embodiment has been described. Next, commonization of a block structure according to the present embodiment will be described. FIG. 13 is a diagram for explaining the commonization of the block structure according to the present embodiment. The left side of FIG. 13 illustrates a network structure designed by a user, and the right side of FIG. 13 illustrates a network structure after being optimized for hardware.

Referring to FIG. 13, the network configuration at the time of design includes two layer configurations that are connected in the order of "Convolution", "BatchNormalization", "ReLU", and "MaxPooling". In the present embodiment, a configuration including the same layers as described above in the same order is defined as a block. That is, in the example illustrated in FIG. 13, the network configuration at the time of design includes two blocks B1 and B2.

On the other hand, the blocks B1 and B2 have different kernel shapes related to "Convolution" and thus have different input-output sizes. In such a case, even though the layer configurations are the same, it is not possible to commonize and use the same calculation circuit.

Therefore, the form control unit 210 according to the present embodiment may suggest to the user that the kernel shape of "Convolution" should be commonized to "3, 3" and the input-output sizes are the same so that the blocks B1 and B2 can commonize and use a common calculation circuit. With such optimization, it is possible to save an area of a hardware circuit by commonizing the calculation circuit.

Furthermore, the optimization according to the present embodiment may also include, in addition to the block, a change for commonizing parameters between a plurality of layers of the same type included in the network structure. The aforementioned change includes, for example, a change for commonizing a filter size, and output size, and the like between layers of the same type.

Figure 14:
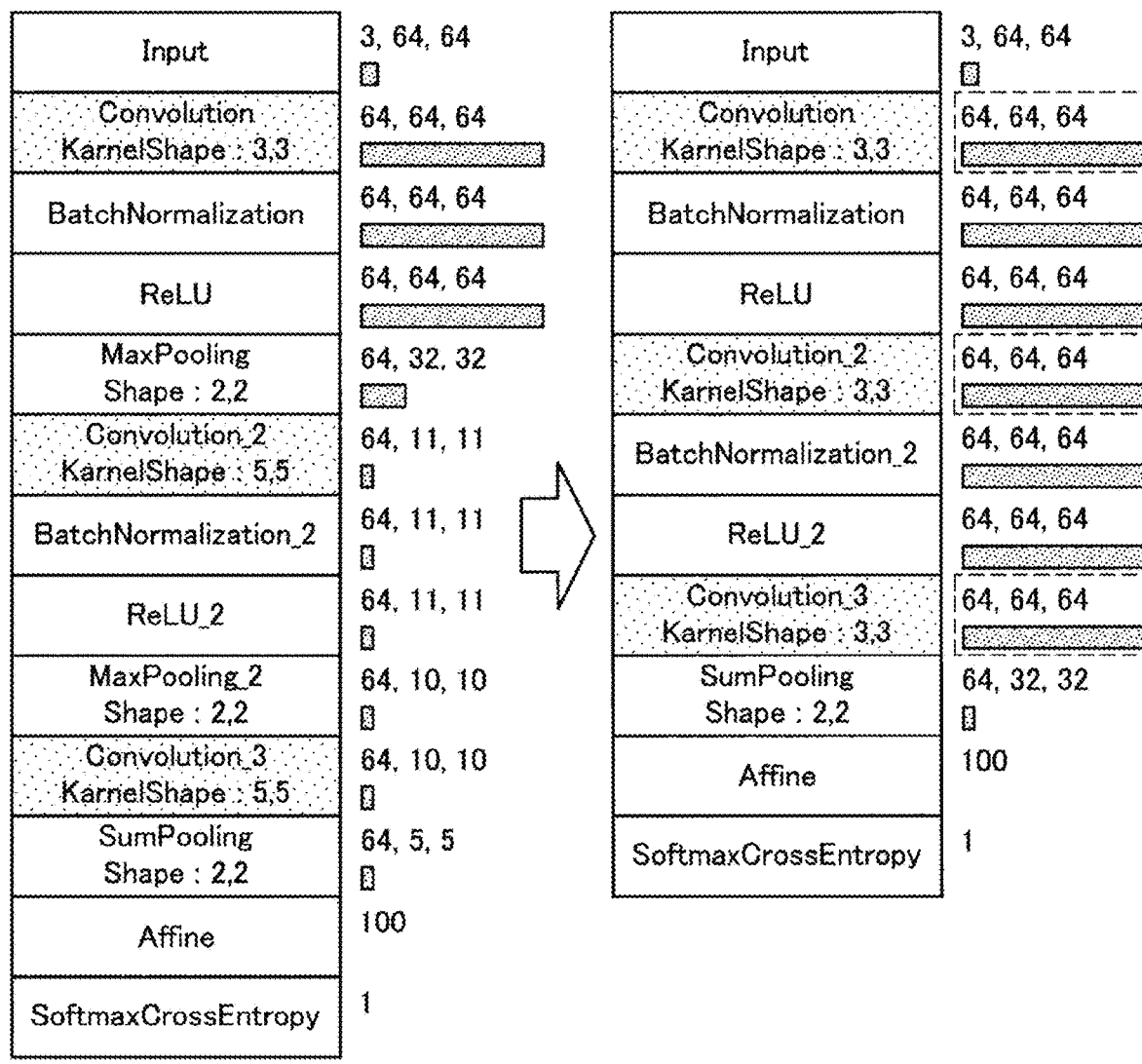
FIG. 14 is a diagram for explaining commonization of components used between layers of the same type according to the embodiment.

FIG. 14 is a diagram for explaining commonization of components used between layers of the same type according to the present embodiment. The left side of FIG. 14 illustrates a network structure designed by a user, and the right side of FIG. 14 illustrates a network structure after being optimized for hardware.

Referring to FIG. 14, it can be seen that the network configuration at the time of design includes three "Convolution" layers, but the output size and the kernel shape are not commonized. In such a case, the form control unit 210 according to the present embodiment may suggest to the user that the three "Convolution" layers should use common parameters. In the case of the example illustrated in FIG. 14, the form control unit 210 may suggest that the output size and the filter size (kernel shape) should be commonized in the three "Convolution" layers.

At this time, in order to implement the aforementioned commonization, "MaxPooling" is deleted in the network structure after the optimization. In this way, in the optimization using the common component according to the present embodiment, deletion, insertion, replacement, order change, and the like of layers may be suggested. Furthermore, the block described above may be defined as including at least one layer. In such a case, the three "Convolution" layers illustrated in FIG. 14 may each be referred to as a block.

In accordance with the aforementioned optimization according to the present embodiment, parameters and the like used for blocks and layers are commonized, so that it is possible to reduce the number of parameters used by a network and to effectively reduce power consumption of a memory load.

Figure 15:
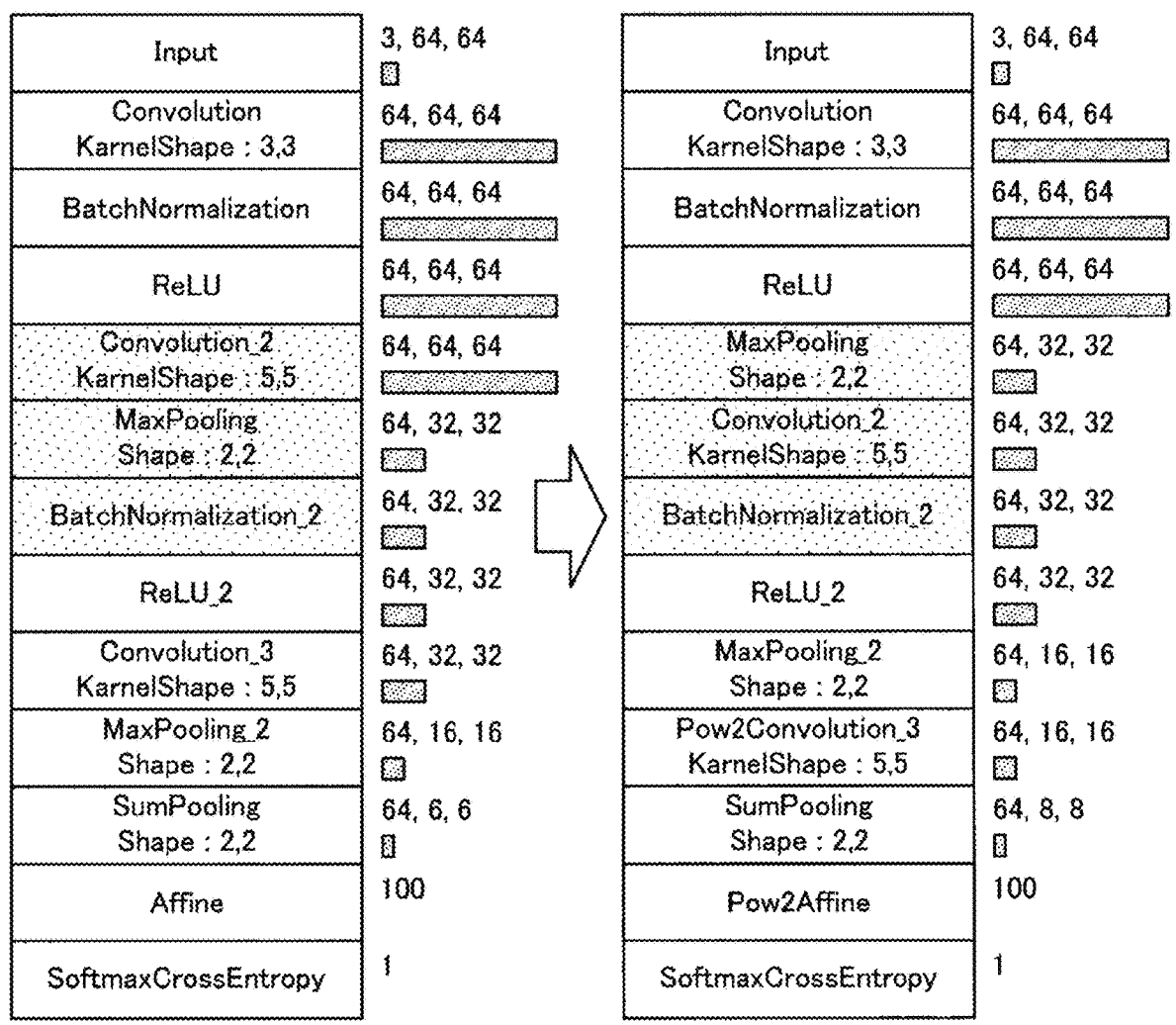
FIG. 15 is a diagram for explaining optimization for the purpose of improving the efficiency of calculation processing related to a product-sum calculation and Batch Normalization according to the embodiment.

Next, optimization for the purpose of improving the efficiency of calculation processing related to a product-sum calculation and Batch Normalization according to the present embodiment will be described. The optimization according to the present embodiment may include a change in a network structure for the purpose of improving the efficiency of the aforementioned calculation processing. FIG. 15 is a diagram for explaining the optimization for the purpose of improving the efficiency of the calculation processing related to the product-sum calculation and the Batch Normalization according to the present embodiment. The left side of FIG. 15 illustrates a network structure designed by a user, and the right side of FIG. 15 illustrates a network structure after being optimized for hardware.

Referring to FIG. 15, in the network configuration at the time of design, "MaxPooling" is arranged between "Convolution_2" and "BatchNormalization_2". However, after learning, parameters of the "BatchNormalization" layer can be merged into parameters of the product-sum calculation layer.

Therefore, the form control unit 210 according to the present embodiment may suggest that the "BatchNormalization" layer should be arranged immediately after the product-sum calculation layer. In the case of the example illustrated in FIG. 15, the form control unit 210 can suggest to the user to switch the order of "Convolution_2" and "MaxPooling" arranged between the product-sum calculation layer and the "BatchNormalization" layer.

Furthermore, when there is a layer configuration in which biases are continuous such that the "BatchNormalization" layer is arranged immediately after the product-sum calculation layer, the form control unit 210 according to the present embodiment may also suggest to apply a bias only to a layer arranged in the subsequent stage.

Figure 16:
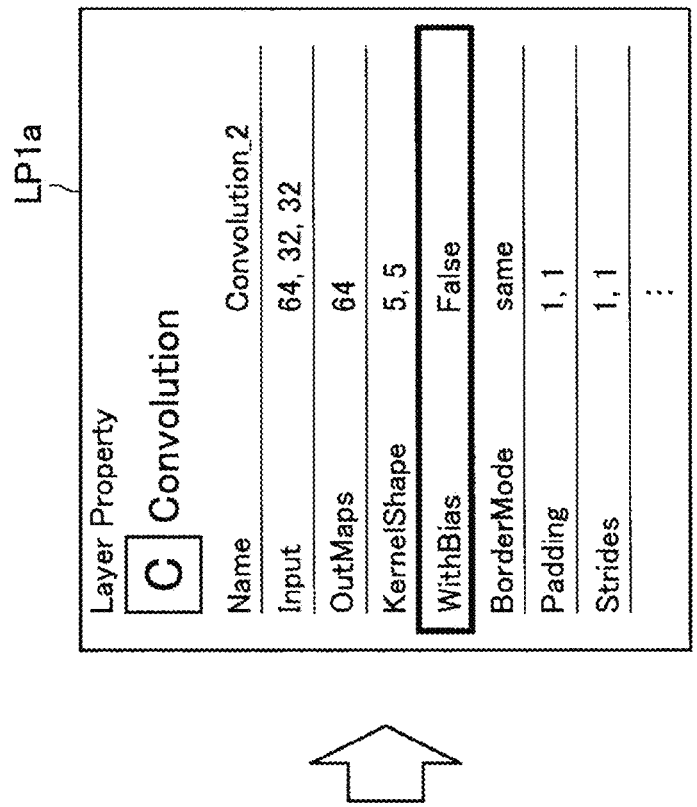
FIG. 16 is a diagram for explaining bias optimization according to the embodiment.

FIG. 16 is a diagram for explaining bias optimization according to the present embodiment. The left side of FIG. 16 illustrates property information LP1b of "Convolution_2" in the network structure at the time of design illustrated in FIG. 15, and the right side of FIG. 16 illustrates property information LP1a of "Convolution_2" in the network structure after the optimization illustrated in FIG. 15.

When the property information LP1b and the property information LP1a are compared with each other, it can be seen that bias setting is changed to "False" in the property information LP1b after the optimization. In this way, the form control unit 210 according to the present embodiment suggests to apply a bias only to a layer arranged in the subsequent stage, so that it is possible to prevent an unnecessary increase in the calculation cost.

Figure 17:
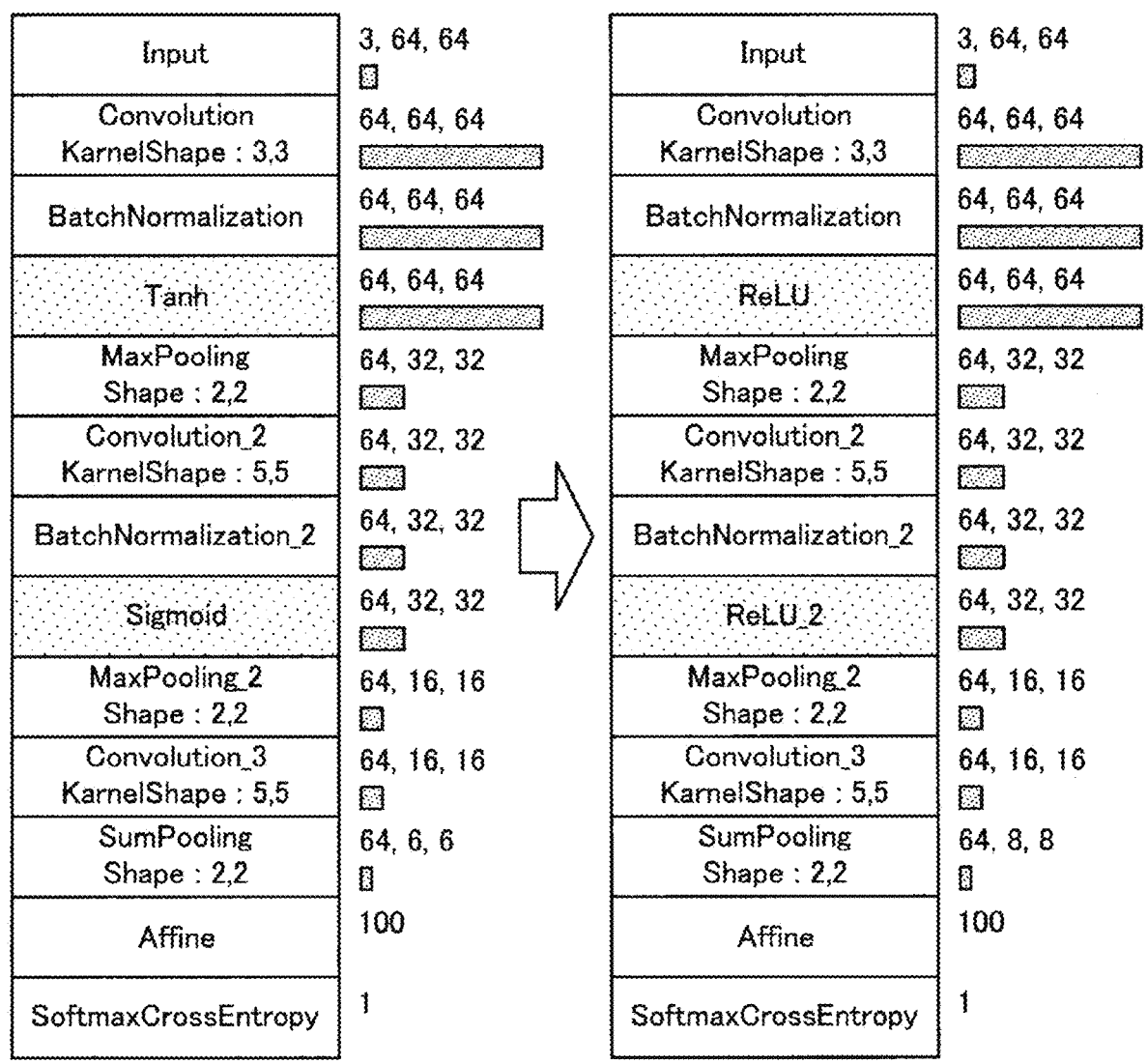
FIG. 17 is a diagram for explaining optimization for the purpose of eliminating a non-linear function requiring a lookup table reference according to the embodiment.

Furthermore, the optimization according to the present embodiment may also include a change in a network structure for the purpose of eliminating a non-linear function requiring a lookup table reference. FIG. 17 is a diagram for explaining the optimization for the purpose of eliminating the non-linear function requiring the lookup table reference according to the present embodiment. The left side of FIG. 17 illustrates a network structure designed by a user, and the right side of FIG. 17 illustrates a network structure after being optimized for hardware.

When the two network structures are compared with each other, "Tank" and "Sigmoid" included in the network configuration at the time of design is changed to "ReLU" after the optimization. In this way, the form control unit 210 according to the present embodiment can suggest to the user to use a linear function such as "ReLU", instead of the non-linear function requiring the lookup table reference. With such control, it is possible to effectively reduce unnecessary memory consumption and power consumption.

Figure 18:
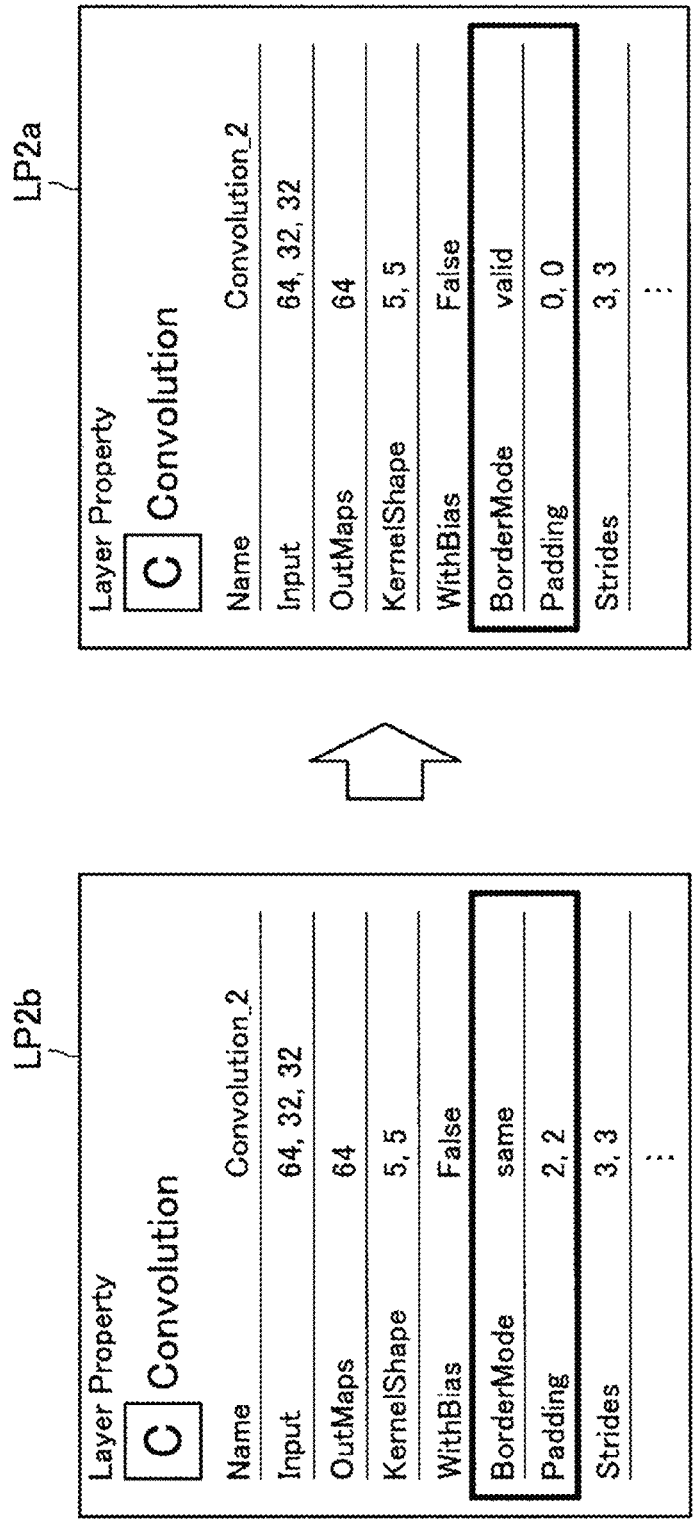
FIG. 18 is a diagram for explaining optimization for the purpose of eliminating padding according to the embodiment.

Furthermore, the optimization according to the present embodiment may also include a change in a network structure for the purpose of eliminating padding. FIG. 18 is a diagram for explaining the optimization for the purpose of eliminating the padding according to the present embodiment. The left side of FIG. 18 illustrates property information LP2b of "Convolution" included in the network structure at the time of design, and the right side of FIG. 18 illustrates property information LP2a of "Convolution" included in the network structure after the optimization.

When the property information LP2b and the property information LP2a are compared with each other, the setting has been changed so that no padding is performed in the network after the optimization. In this way, the form control unit 210 according to the present embodiment suggests to the user that the padding, which is inefficient processing for hardware, should not be performed, so that it is possible to improve processing efficiency.

Furthermore, the optimization according to the present embodiment may also include a change in a network structure for the purpose of suppressing the width of a stride to 2 or less. FIG. 19 is a diagram for explaining the optimization for the purpose of suppressing the width of the stride to 2 or less according to the present embodiment. The left side of FIG. 19 illustrates property information LP3b of "Convolution" included in the network structure at the time of design, and the right side of FIG. 19 illustrates property information LP3a of "Convolution" included in the network structure after the optimization.

When the property information LP3b and the property information LP3a are compared with each other, the stride is changed to "2, 2" in the network structure after the optimization. In this way, the form control unit 210 according to the present embodiment suggests to the user that a processing load due to the stride should not excessively increase, so that it is possible to improve processing efficiency.

Figure 20:
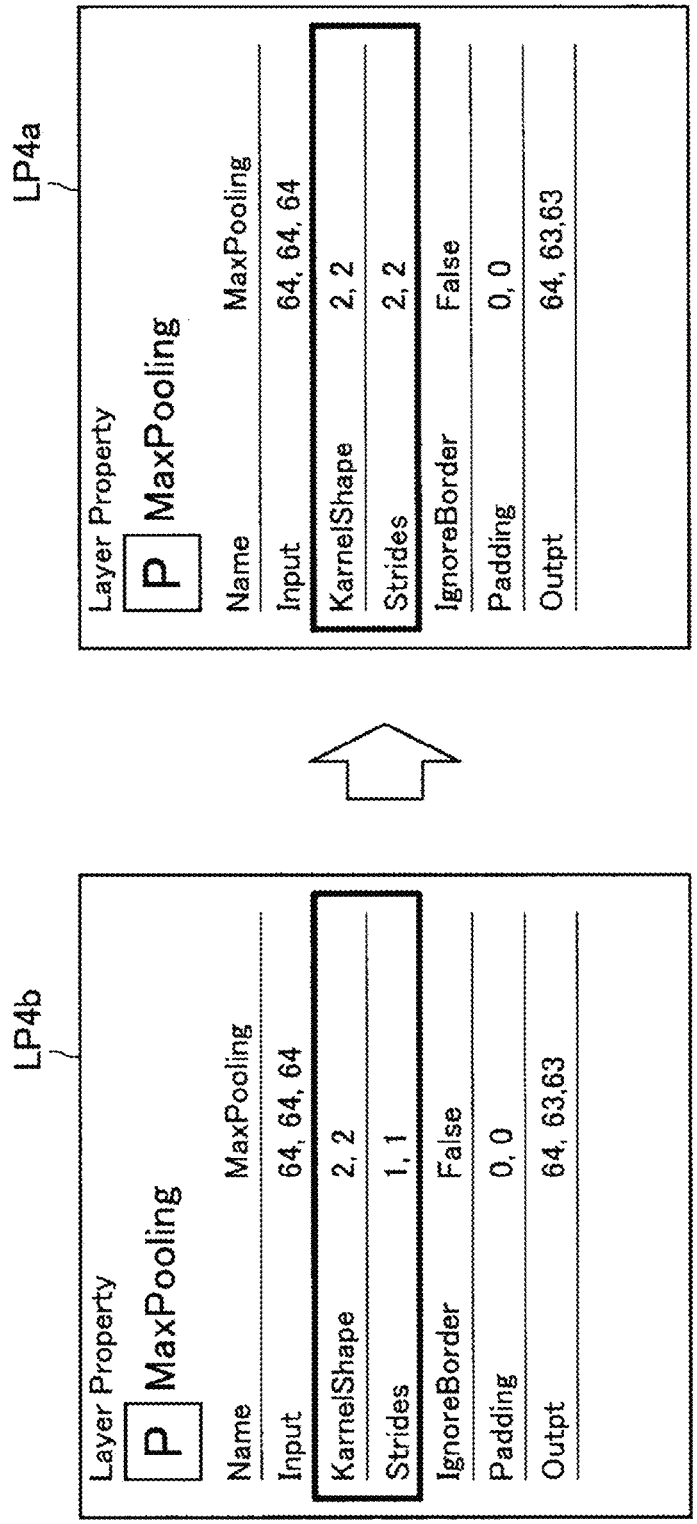
FIG. 20 is a diagram for explaining optimization for the purpose of eliminating overlapping of Pooling regions according to the embodiment.

Furthermore, the optimization according to the present embodiment may also include a change in a network structure for the purpose of eliminating overlapping of Pooling regions. FIG. 20 is a diagram for explaining the optimization for the purpose of eliminating the overlapping of the Pooling regions according to the present embodiment. The left side of FIG. 20 illustrates property information LP4b of "Maxpooling" included in the network structure at the time of design, and the right side of FIG. 20 illustrates property information LP4a of "Maxpooling" included in the network structure after the optimization.

When the property information LP4b and the property information LP4a are compared with each other, it can be seen that in the network structure after the optimization, the values of the kernel shape and the stride are commonized to "2, 2" and the Pooling regions are changed so as not to overlap. When striding, it is necessary to retain data read once or to read data again. Thus, by optimizing the Pooling regions so as not to overlap, it is possible to reduce a memory corresponding to data to be retained or the number of times of accesses to data.

Figure 21:
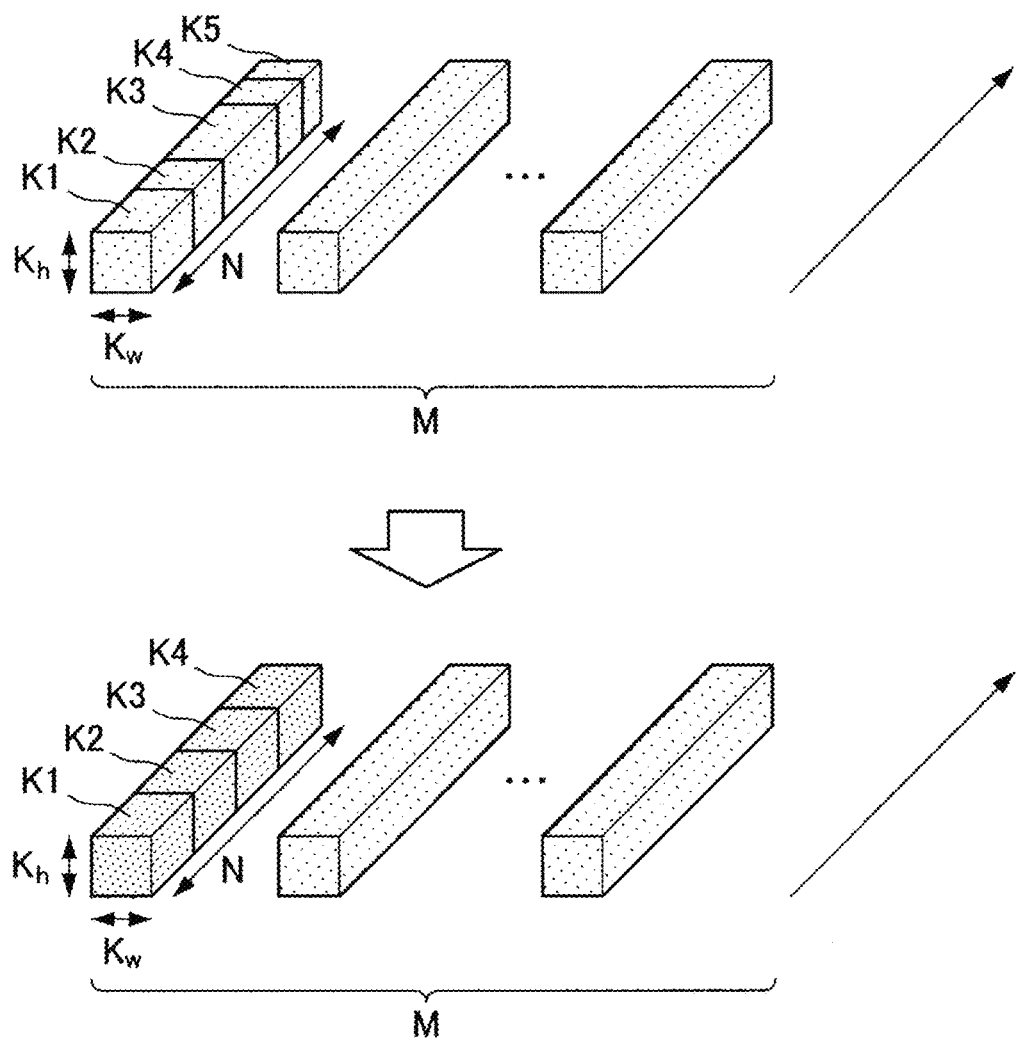
FIG. 21 is a diagram for explaining optimization for the purpose of structuring a kernel used in a layer according to the embodiment.

Furthermore, the optimization according to the present embodiment may also include a change in a network structure for the purpose of structuring a kernel used in a layer. FIG. 21 is a diagram for explaining the optimization for the purpose of structuring the kernel used in the layer according to the present embodiment. The upper part of FIG. 21 illustrates an example of a kernel at the time of design, and the lower part of FIG. 21 illustrates an example of a kernel after the optimization.

When performing a Convolution calculation in hardware, a process of partially reading a kernel K into an SRAM in a depth direction is performed as illustrated in the drawing. Note that in FIG. 21, $K_h$ indicates the height of the kernel and $K_w$ indicates the width of the kernel. Furthermore, N indicates the length in the depth direction of a feature map to be input and M indicates a feature map to be output.

In such a case, as illustrated in the upper part of FIG. 21, the structures of the kernels K1 to K5 are not commonized, resulting in an increase in the number of times by which the kernel is read into the SRAM. On the other hand, as illustrated in the lower part of FIG. 21, when the structures of the kernels K1 to K4 are commonized, it is possible to reduce the number of times by which the kernel is read into the SRAM.

So far, the optimization according to the present embodiment has been described with detailed examples. In the above, the case where the form control unit 210 according to the present embodiment provides the form that implements the visual programming of the neutral network has been described. On the other hand, the programming tool according to the present embodiment is not limited to such examples. The form control unit 210 according to the present embodiment may control the presentation of the information related to the optimization structure in the programming tool that performs normal code description.

FIG. 22 is a diagram for explaining the information presentation of the optimization structure in the programming tool for performing the normal code description according to the present embodiment. The upper part of FIG. 22 illustrates an example of a code at the time of design, and the lower part of FIG. 22 illustrates an example of a code after the optimization.

When the two codes are compared with each other, the code after optimization is changed so that the shift calculation using "256" is performed in the image normalization. Furthermore, it can be seen that "Convolution" and "Affine" are changed to the quantization layer. Furthermore, it can be seen that "AveragePooling" is changed to "SumPooling" requiring no division.

In this way, in accordance with the information processing server 20 according to the present embodiment, it is possible to provide design support useful for the hardware implementation of the neural network regardless of the type of programming.

1.6 Example of Presentation of Information Related to Optimization Structure Next, an example of the presentation of information related to the optimization structure according to the present embodiment will be described. As described above, the form control unit 210 according to the present embodiment can assist a user in designing a neural network optimized for hardware by suggesting information related to various types of optimization to the user.

At this time, the form control unit 210 may control whether to present information based on user's setting, for example. FIG. 23 is a diagram illustrating an example of the presentation of information related to the optimization structure according to the present embodiment.

For example, FIG. 23 illustrates a window W1 displayed when a right-click is performed in the pane P2. The window W1 may display a list for performing or controlling a plurality of functions including functions F1 and F2.

The function F1 may be a function for a user to set the necessity of the presentation of information related to the optimization structure. In the case of an example illustrated in FIG. 23, "HW affinity" corresponding to the function F1 has a check mark indicating that the function is enabled.

In such a case, when the generation unit 220 detects a network structure capable of optimizing the generation unit during the execution of programming by the user, the form control unit 210 allows, for example, a message Msg as illustrated in FIG. 23 to be displayed, thereby presenting the information related to the optimization structure to the user. Note that the information presentation as described above may be implemented by voice. Furthermore, the message Msg may be controlled to be displayed only when the mouse is clicked on an icon I, for example.

Note that the form control unit 210 allows the user to be presented with a network optimized by the generation unit 220 when the user approves the information presentation as described above. That is, the form control unit 210 may reflect the optimized network structure in a network configuration being generated. Note that the user's approval may be performed by pressing a button or using voice, for example.

Furthermore, the reflection of the optimized network structure as described above may be automatically performed without information presentation. The automatic reflection as described above can be performed by user's setting.

Furthermore, the function F2 may be a function for immediately performing the presentation of information related to the optimization structure regardless of the setting of the necessity of the information presentation by the function F1. For example, even when dynamic information presentation is set to be disabled by the function F1, the user can enjoy the presentation of information related to the optimization structure by clicking "Redundancy check" corresponding to the function F2 at any timing such as after the completion of programming.

Furthermore, the form control unit 210 according to the present embodiment can also control the form so that programming not suitable for hardware is not performed. In the case of an example illustrated in FIG. 23, the form control unit 210 controls "AveragePooling" requiring division so as not to be arranged in the pane P1 by the user in the first place. In accordance with the aforementioned function of the form control unit 210 according to the present embodiment, it is also possible to control design not suitable for hardware not to be performed by the user.

Furthermore, the form control unit 210 according to the present embodiment also enables the user to be presented with the information related to the optimization structure after the optimization based on a feature of hardware selected by the user and optimization setting set by the user.

Figure 24:
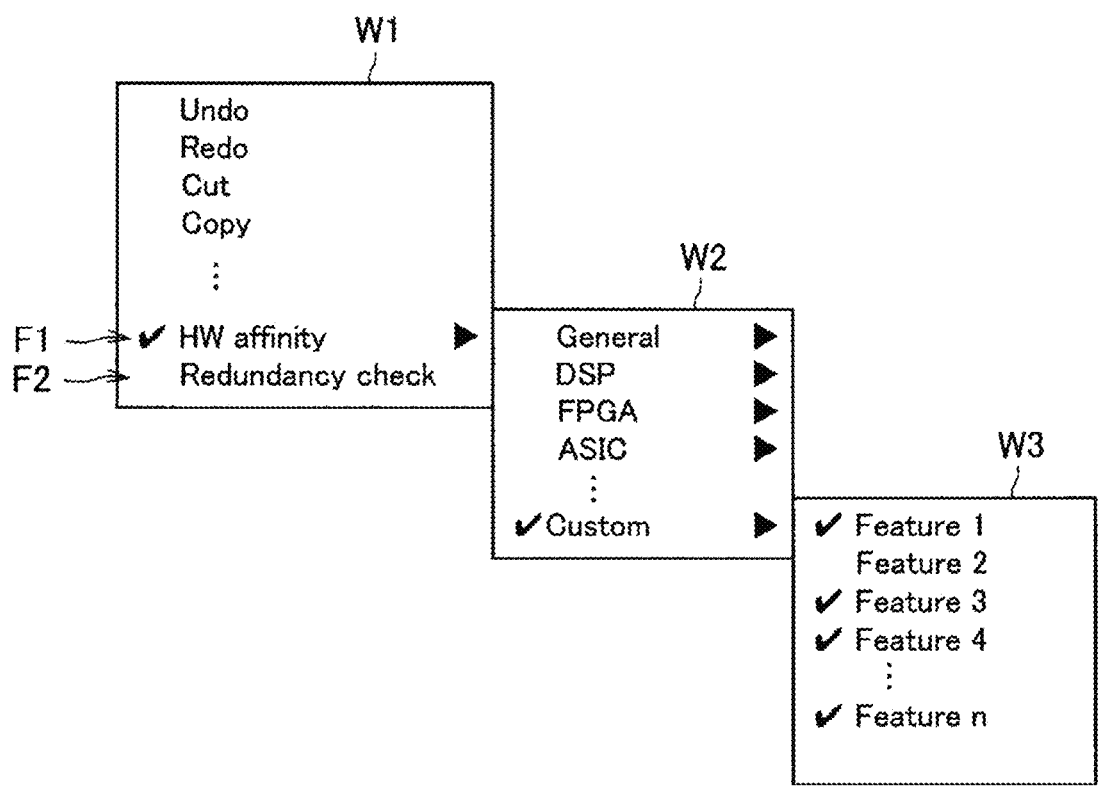
FIG. 24 is a diagram for explaining information presentation based on features of hardware selected by a user and optimization setting set by the user according to the embodiment.

FIG. 24 is a diagram for explaining the information presentation based on features of the hardware selected by the user and the optimization setting set by the user according to the present embodiment.

FIG. 24 illustrates an example of a hierarchical structure of a menu including the window W1 illustrated in FIG. 23. The user can display a window W2 by clicking the mouse on "HW affinity" corresponding to the function F1.

The window W2 may be a window for selecting a hardware type for presenting the information related to the optimization structure. In the case of an example illustrated in FIG. 24, the window W2 displays a list of hardware types such as "General", "DSP", "FPGA", and "ASIC". The user selects a hardware type to be subjected to hardware implementation from the aforementioned hardware types, thereby enjoying the information of the optimization structure set specifically for the hardware type.

Furthermore, in the window W2, a menu "Custom" is displayed for the user to select an optimization method for receiving the information presentation. When the user clicks the mouse on the menu "Custom", a window W3 for selecting an optimization method to be enabled can be displayed. Note that "Feature 1" to "Feature n" illustrated in FIG. 24 may be items corresponding to various optimization methods described with reference to FIG. 6 to FIG. 21.

In this way, in accordance with the information processing server 20 according to the present embodiment, it is possible to implement more effective information presentation based on the features of the hardware selected by the user and the optimization setting set by the user.

2. Hardware Configuration Example

Figure 25:
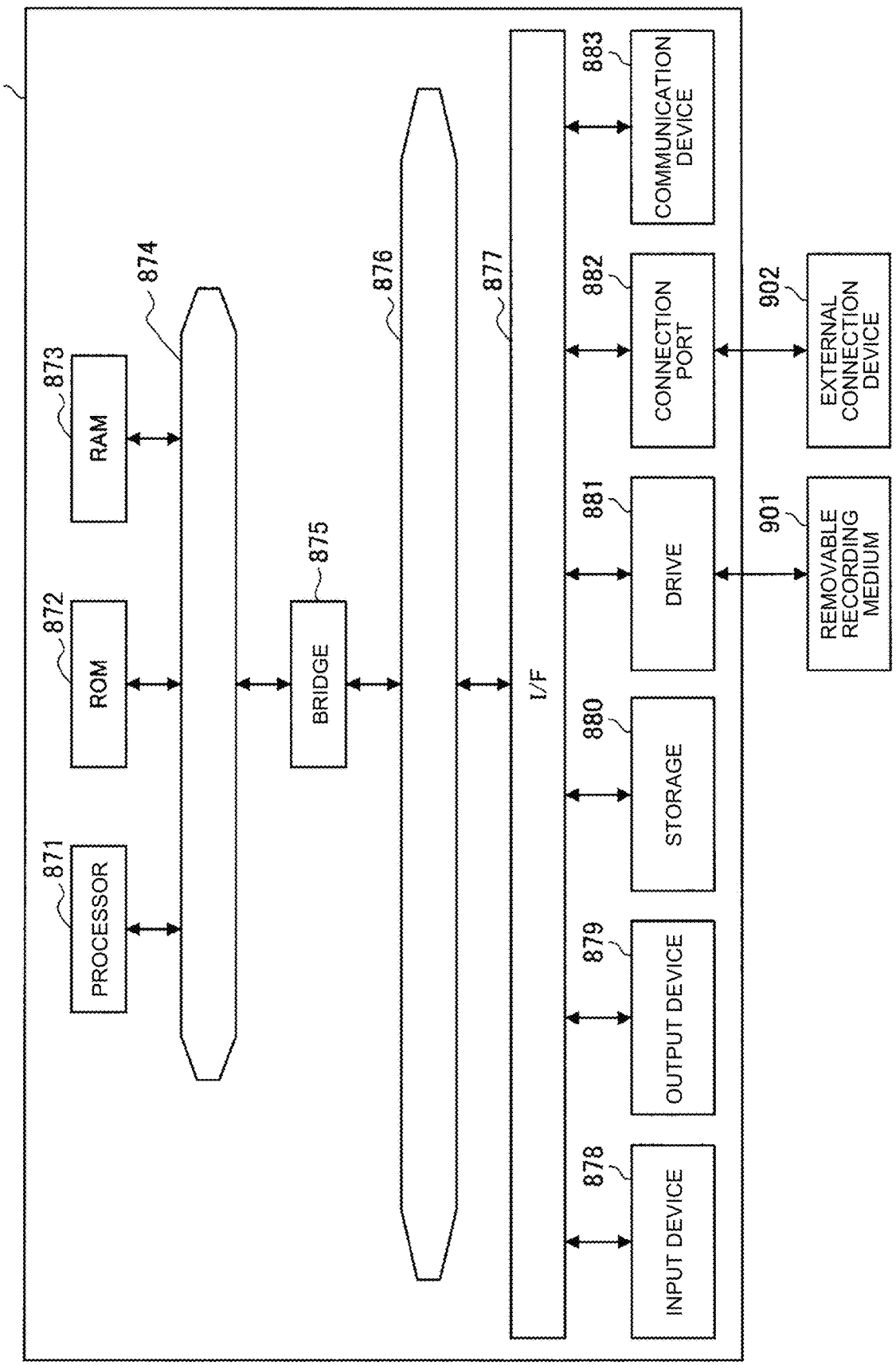
FIG. 25 is a diagram illustrating a hardware configuration example of an information processing server according to the embodiment of the present disclosure.

Next, a hardware configuration example of the information processing server 20 according to the embodiment of the present disclosure will be described. FIG. 25 is a diagram illustrating the hardware configuration example of the information processing server 20 according to the embodiment of the present disclosure. Referring to FIG. 25, the information processing server 20 includes, for example, a processor 871, a ROM 872, a RAM 873, a host bus 874, a bridge 875, an external bus 876, an interface 877, an input device 878, an output device 879, a storage 880, a drive 881, a connection port 882, and a communication device 883. Note that the hardware configuration illustrated in the drawing is an example and some of the components may be omitted. Furthermore, the hardware configuration may further include components other than the components illustrated in the drawing.

Processor 871

The processor 871 serves as, for example, a calculation processing device or a control device, and controls the all or some of operations of each component based on various computer programs recorded on the ROM 872, the RAM 873, the storage 880, or a removable recording medium 901.

ROM 872, RAM 873

The ROM 872 is a device that stores therein computer programs read by the processor 871, data used for calculation, and the like. The RAM 873 temporarily or permanently stores therein, for example, the computer programs read by the processor 871, various parameters appropriately changed when the computer programs are executed, and the like.

Host Bus 874, Bridge 875, External Bus 876, Interface 877

The processor 871, the ROM 872, and the RAM 873 are mutually connected via, for example, the host bus 874 capable of performing high-speed data transmission. On the other hand, the host bus 874 is connected to the external bus 876, which has a relatively low data transmission rate, via the bridge 875, for example. Furthermore, the external bus 876 is connected to various components via the interface 877.

Input Device 878

As the input device 878, for example, a mouse, a keyboard, a touch screen, a button, a switch, a lever, and the like are used. Moreover, as the input device 878, a remote controller (hereinafter, referred to as remocon) capable of transmitting a control signal by using infrared rays or other radio waves may be used. Furthermore, the input device 878 includes a voice input device such as a microphone.

Output Device 879

The output device 879 is, for example, a device capable of visually or audibly notifying a user of acquired information, such as a display device such as a cathode ray tube (CRT) display, an LCD, or an organic EL display, an audio output device such as a speaker or a headphone, a printer, a cellular phone, or a facsimile. Furthermore, the output device 879 according to the present disclosure includes various vibration devices capable of outputting tactile stimulation.

Storage 880

The storage 880 is a device for storing various data. As the storage 880, for example, a magnetic storage device such as a hard disk drive (HDD), a semiconductor storage device, an optical storage device, a magneto-optical storage device, or the like are used.

Drive 881

The drive 881 is, for example, a device that reads information recorded on the removable recording medium 901 such as a magnetic disk, an optical disc, a magneto-optical disk, or a semiconductor memory, or writes information on the removable recording medium 901.

Removable Recording Medium 901

The removable recording medium 901 is, for example, a DVD medium, a Blu-ray (registered trademark) medium, an HD-DVD medium, various semiconductor storage media, or the like. Of course, the removable recording medium 901 may be, for example, an IC card provided with a non-contact-type IC chip, electronic equipment, or the like.

Connection Port 882

The connection port 882 is, for example, a port for connecting an external connection device 902 such as a universal serial bus (USB) port, an IEEE 1394 port, a small computer system interface (SCSI), an RS-232C port, or an optical audio terminal.

External Connection Device 902

The external connection device 902 is, for example, a printer, a portable music player, a digital camera, a digital video camera, an IC recorder, or the like.

Communication Device 883

The communication device 883 is a communication device for connecting to a network, and is, for example, a communication card for a wired or wireless LAN, Bluetooth (registered trademark), or wireless USB (WUSB), a router for optical communication, a router for asymmetric digital subscriber line (ADSL), various communication modems, or the like.

3. Summary

As described above, the information processing server 20 according to an embodiment of the present disclosure includes the form control unit 210 that controls the presentation of the information related to the optimization structure when at least a part of the network structure of the designed neural network has been optimized for hardware processing. With such a configuration, it is possible to provide design support useful for hardware implementation of the neural network.

So far, although preferred embodiments of the present disclosure have been described in detail with reference to the accompanying drawings, the technical range of the present disclosure is not limited to such examples. It is apparent that a person having ordinary skill in the technical field of the present disclosure can arrive at various modified examples or corrected examples within the category of the technical idea described in claims, and it is understood that the modified examples and corrected examples are naturally included in the technical range of the present disclosure.

Furthermore, the effects described in the present specification are merely explanatory or exemplary, and are not restrictive. That is, the technology according to the present disclosure can obtain other effects clear to a person skilled in the art from the description of the present specification in addition to or instead of the aforementioned effects.

Furthermore, it is also possible to generate a computer program for causing the hardware such as the CPU, the ROM, and the RAM included in the computer to exhibit the same function as that of the configuration of the information processing server 20, and a computer readable recording medium recording the computer program therein can also be provided.

Note that the following configurations also belong to the technical range of the present disclosure.

(1)

An information processing device comprising:

a control unit that controls presentation of information related to an optimization structure when at least a part of a network structure of a designed neural network has been optimized for hardware processing.

(2)

The information processing device according to (1), wherein the information related to the optimization structure includes information related to a difference between a current network structure and a network structure after optimization, and the control unit allows a user to be presented with the information related to the difference.

(3)

The information processing device according to (1) or (2), wherein the information related to the optimization structure includes a reason that the optimization needs to be performed, and the control unit allows a user to be presented with the reason that the optimization needs to be performed.

(4)

The information processing device according to any one of (1) to (3), wherein the information related to the optimization structure includes an optimized network structure, and the control unit allows a user to be presented with the optimized network structure.

(5)

The information processing device according to any one of (1) to (4), wherein the control unit allows the information related to the optimization structure to be presented on a programming tool used for designing a neutral network.

(6)

The information processing device according to (5), wherein the control unit allows a user to be dynamically presented with the information related to the optimization structure during programming by the user.

(7)

The information processing device according to (6), wherein the control unit allows the user to be dynamically presented with the information related to the optimization structure when a network structure, in which the optimization is possible, is detected during the programming by the user.

(8)

The information processing device according to any one of (5) to (7), wherein, based on approval of a user who has confirmed the information related to the optimization structure, the control unit allows the user to be presented with an optimized network structure.

(9)

The information processing device according to any one of (5) to (8), wherein the control unit allows a user to be presented with the information related to the optimization structure when the optimization has been performed based on a feature of hardware selected by the user.

(10)

The information processing device according to any one of (5) to (9), wherein the control unit allows a user to be presented with the information related to the optimization structure when the optimization has been performed based on optimization setting set by the user.

(11)

The information processing device according to any one of (5) to (10), wherein the control unit controls the programming tool such that programming not suitable for the hardware processing is not performed.

(12)

The information processing device according to any one of (1) to (11), wherein the optimization includes a change in a network structure for the purpose of eliminating division.

(13)

The information processing device according to any one of (1) to (12), wherein the optimization includes a change in a network structure for the purpose of applying a shift calculation.

(14)

The information processing device according to any one of (1) to (13), wherein the optimization includes a change in a network structure for the purpose of commonizing an input size and an output size between a plurality of blocks included in the network structure, and each of the blocks includes at least one layer.

(15)

The information processing device according to (14), wherein the optimization includes a change in a network structure for the purpose of commonizing a calculation circuit that performs processing related to the blocks.

(16)

The information processing device according to any one of (1) to (15), wherein the optimization includes a change in a network structure for the purpose of commonizing a parameter between a plurality of layers of the same type included in the network structure.

(17)

The information processing device according to any one of (1) to (16), wherein the optimization includes a change in a network structure for the purpose of commonizing a filter or an output size between a plurality of layers of the same type included in the network structure.

(18)

The information processing device according to any one of (1) to (17), wherein the optimization includes a change in a network structure for the purpose of improving efficiency of calculation processing related to a product-sum calculation and Batch Normalization.

(19)

The information processing device according to any one of (1) to (18), wherein the optimization includes a change in a network structure for the purpose of eliminating a non-linear function requiring a lookup table reference.

(20)

An information processing method comprising:

a step of controlling, by a processor, presentation of information related to an optimization structure when at least a part of a network structure of a designed neural network has been optimized for hardware processing.

REFERENCE SIGNS LIST 10 information processing terminal
110 display unit
120 input unit
130 control unit
140 server communication unit
20 information processing server
210 form control unit
220 generation unit
230 terminal communication unit

The invention claimed is:

1. An information processing device comprising:
a processor that controls presentation of information related to an optimization structure when at least a part of a network structure of a designed neural network has been optimized for hardware processing, wherein
the processor allows the information related to the optimization structure to be presented on a programming tool used for designing a neutral network,
the processor allows a user to be dynamically presented with the information related to the optimization structure during programming by the user, and
the processor allows the user to be dynamically presented with the information related to the optimization structure when a network structure, in which the optimization is possible, is detected automatically during the programming by the user.

2. The information processing device according to claim 1, wherein
the information related to the optimization structure includes information related to a difference between a current network structure and a network structure after optimization, and
the processor allows a user to be presented with the information related to the difference.

3. The information processing device according to claim 1, wherein
the information related to the optimization structure includes a reason that the optimization needs to be performed, and
the processor allows a user to be presented with the reason that the optimization needs to be performed.

4. The information processing device according to claim 1, wherein
the information related to the optimization structure includes an optimized network structure, and
the processor allows a user to be presented with the optimized network structure.

5. The information processing device according to claim 1, wherein, based on approval of a user who has confirmed the information related to the optimization structure, the processor allows the user to be presented with an optimized network structure.

6. The information processing device according to claim 1, wherein the processor allows a user to be presented with the information related to the optimization structure when the optimization has been performed based on a feature of hardware selected by the user.

7. The information processing device according to claim 1, wherein the processor allows a user to be presented with the information related to the optimization structure when the optimization has been performed based on optimization setting set by the user.

8. The information processing device according to claim 1, wherein the processor controls the programming tool such that programming not suitable for the hardware processing is not performed.

9. The information processing device according to claim 1, wherein the optimization includes a change in a network structure for a purpose of eliminating division.

10. The information processing device according to claim 1, wherein the optimization includes a change in a network structure for a purpose of applying a shift calculation.

11. The information processing device according to claim 1, wherein
the optimization includes a change in a network structure for a purpose of commonizing an input size and an output size between a plurality of blocks included in the network structure, and
each of the blocks includes at least one layer.

12. The information processing device according to claim 11, wherein the optimization includes a change in a network structure for a purpose of commonizing a calculation circuit that performs processing related to the blocks.

13. The information processing device according to claim 1, wherein the optimization includes a change in a network structure for a purpose of commonizing a parameter between a plurality of layers of the same type included in the network structure.

14. The information processing device according to claim 1, wherein the optimization includes a change in a network structure for a purpose of commonizing a filter or an output size between a plurality of layers of the same type included in the network structure.

15. The information processing device according to claim 1, wherein the optimization includes a change in a network structure for a purpose of improving efficiency of calculation processing related to a product-sum calculation and Batch Normalization.

16. The information processing device according to claim 1, wherein the optimization includes a change in a network structure for a purpose of eliminating a non-linear function requiring a lookup table reference.

17. An information processing method comprising:
controlling, by a processor, presentation of information related to an optimization structure when at least a part of a network structure of a designed neural network has been optimized for hardware processing, wherein
the processor allows the information related to the optimization structure to be presented on a programming tool used for designing a neutral network,
the processor allows a user to be dynamically presented with the information related to the optimization structure during programming by the user, and
the processor allows the user to be dynamically presented with the information related to the optimization structure when a network structure, in which the optimization is possible, is detected automatically during the programming by the user.

* * * * *